(12) United States Patent
Liaw

(10) Patent No.: US 11,915,946 B2
(45) Date of Patent: Feb. 27, 2024

(54) SEMICONDUCTOR DEVICES AND METHODS OF MANUFACTURING

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/804,965

(22) Filed: Jun. 1, 2022

(65) Prior Publication Data

US 2022/0301897 A1 Sep. 22, 2022

Related U.S. Application Data

(62) Division of application No. 16/806,267, filed on Mar. 2, 2020, now Pat. No. 11,355,363.

(60) Provisional application No. 62/894,283, filed on Aug. 30, 2019.

(51) Int. Cl.
*H01L 29/786* (2006.01)
*H01L 21/033* (2006.01)
*H01L 21/04* (2006.01)
*H01L 21/67* (2006.01)

(52) U.S. Cl.
CPC .... *H01L 21/67075* (2013.01); *H01L 21/0334* (2013.01); *H01L 21/048* (2013.01)

(58) Field of Classification Search
CPC .................. H01L 29/42392; H01L 29/78696
See application file for complete search history.

(56) References Cited

U.S. PATENT DOCUMENTS

| | | | |
|---|---|---|---|
| 8,536,023 B2 * | 9/2013 | Or-Bach | H01L 29/785 438/464 |
| 9,412,828 B2 | 8/2016 | Ching et al. | |
| 9,472,618 B2 | 10/2016 | Oxland | |
| 9,484,406 B1 * | 11/2016 | Sun | H01L 29/165 |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,693,008 B2 | 6/2020 | Mukherjee et al. | |
| 11,355,363 B2 * | 6/2022 | Liaw | H01L 29/785 |

(Continued)

*Primary Examiner* — Jarrett J Stark
(74) *Attorney, Agent, or Firm* — Slater Matsil, LLP

(57) ABSTRACT

Semiconductor devices and their manufacturing methods are disclosed herein, and more particularly to semiconductor devices including a transistor having gate all around (GAA) transistor structures and manufacturing methods thereof. Different thickness in an epi-growth scheme is adopted to create different sheet thicknesses within the same device channel regions for use in manufacturing vertically stacked nano structure (e.g., nanosheet, nanowire, or the like) GAA devices. A GAA device may be formed with a vertical stack of nanostructures in a channel region with a topmost nanostructure of the vertical stack being thicker than the other nanostructures of the vertical stack. Furthermore, an LDD portion of the topmost nano structure may be formed as the thickest of the nanostructures in the vertical stack.

20 Claims, 15 Drawing Sheets

(56) References Cited

U.S. PATENT DOCUMENTS

| | | |
|---|---|---|
| 11,404,325 B2* | 8/2022 | Ng ................. H01L 29/7853 |
| 11,594,672 B2* | 2/2023 | Malhotra ............ H10N 30/857 |
| 2006/0076625 A1 | 4/2006 | Lee et al. |
| 2010/0207208 A1 | 8/2010 | Bedell et al. |
| 2012/0138888 A1 | 6/2012 | Chang et al. |
| 2013/0279145 A1 | 10/2013 | Then et al. |
| 2014/0001520 A1 | 1/2014 | Glass et al. |
| 2014/0042386 A1 | 2/2014 | Cea et al. |
| 2014/0084239 A1 | 3/2014 | Radosavljevic et al. |
| 2014/0091279 A1 | 4/2014 | Kachian et al. |
| 2014/0197377 A1 | 7/2014 | Kim et al. |
| 2014/0209865 A1 | 7/2014 | Pillarisetty et al. |
| 2014/0353574 A1* | 12/2014 | Li ................. H01L 29/7841 438/284 |
| 2015/0372119 A1* | 12/2015 | Zhang ............... H01L 21/265 438/268 |
| 2017/0005195 A1* | 1/2017 | Ching ............. H01L 29/66795 |
| 2017/0140933 A1* | 5/2017 | Lee ............... H01L 29/1079 |
| 2017/0141112 A1 | 5/2017 | Ching et al. |
| 2017/0194213 A1 | 7/2017 | Ching et al. |
| 2018/0156749 A1* | 6/2018 | Rozeau ............ G01N 23/2251 |
| 2018/0350685 A1* | 12/2018 | Or-Bach ........... H01L 21/8221 |
| 2019/0013395 A1 | 1/2019 | Witters et al. |
| 2019/0067456 A1 | 2/2019 | Wong et al. |
| 2020/0098756 A1* | 3/2020 | Lilak ............. H01L 29/78696 |
| 2020/0258740 A1* | 8/2020 | Lee .............. H01L 29/66795 |
| 2021/0376137 A1* | 12/2021 | Yang .............. H01L 27/0688 |
| 2022/0059414 A1* | 2/2022 | Yang ............. H01L 21/823475 |
| 2022/0367657 A1* | 11/2022 | Hsu .............. H01L 29/0665 |
| 2023/0010541 A1* | 1/2023 | Chou ............. H01L 29/785 |
| 2023/0017512 A1* | 1/2023 | Lin .............. H01L 29/775 |

* cited by examiner

SEMICONDUCTOR DEVICES AND METHODS OF MANUFACTURING

PRIORITY CLAIM AND CROSS-REFERENCE

This application is a divisional of U.S. patent application Ser. No. 16/806,267, filed on Mar. 2, 2020, entitled "Semiconductor Devices and Methods of Manufacturing," which claims the benefit of U.S. Provisional Application No. 62/894,283, filed on Aug. 30, 2019, entitled "Semiconductor Devices and Methods of Manufacturing," each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
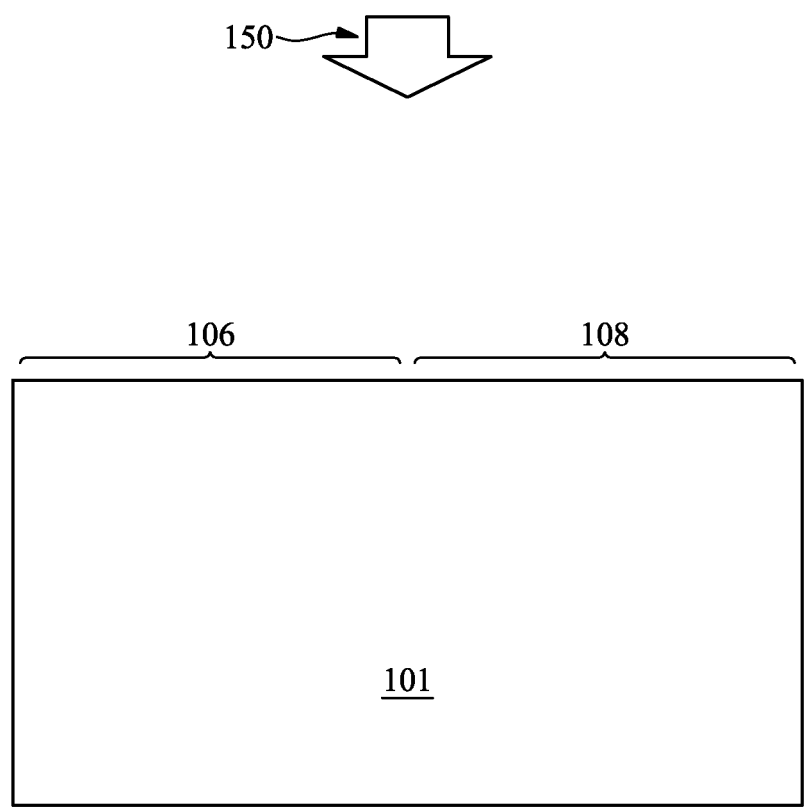
FIGS. 1-11 illustrate intermediate steps in the formation of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to the integration of horizontal gate-all-around nanostructure transistors for use in the design and operation of integrated circuits in the 5 nm technology node and below. Such embodiments allow for fabrication of a GAA device with a topmost channel (e.g., channel closest to a gate top or closest to a gate contact) of a vertical stack to be thicker than the other channels in the vertical stack. Embodiments, however, may be utilized in a wide variety of ways, and are not intended to be limited to the embodiments described herein.

With reference now to FIG. 1, there is illustrated a substrate 101 into which dopants have been implanted in order to form wells. In an embodiment the substrate 101 is a semiconductor substrate, which may be, for example, a silicon substrate, a silicon germanium substrate, a germanium substrate, a III-V material substrate (e.g., GaAs, GaP, GaAsP, AllnAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. In some embodiments, substrate 101 may be a bulk semiconductor substrate, such as a bulk silicon substrate that is a wafer, a semiconductor-on-insulator (SOI) substrate, a multi-layered or gradient substrate, or the like.

FIG. 1 further illustrates that the substrate 101 comprises a first device region 106 for forming n-type devices, such as NMOS transistors (e.g., n-type gate all around transistors) and a second device region 108 for forming p-type devices, such as PMOS transistors (e.g., p-type gate all around transistors). To separate the first device region 106 and the second device region 108, wells (not separately illustrated in FIG. 1) may be formed within the substrate 101 with n-type dopants and p-type dopants. To form the desired wells, the n-type dopants and the p-type dopants are implanted into the substrate 101 depending upon the devices that are desired to be formed. For example, n-type dopants such as phosphorous or arsenic may be implanted to form n-type wells, while p-type dopants such as boron may be implanted to form p-type wells. The n-type wells and p-type wells may be formed using one or more implantation techniques such as diffusion implantations, ion implantations (e.g., plasma doping, beam line implant doping), selective implantations, deep-well implantations, and the like, or combinations thereof. Masking techniques may also be utilized to mask some regions (e.g., second device region 108) of the substrate 101 while exposing other regions (e.g., first device region 106) of the substrate 101 during a first well implantation (e.g., n-type wells) process.

Once the first well implantation process has been completed, the mask is removed to expose the previously masked regions (e.g., second device region 108) and another mask may be placed over the previously exposed regions (e.g., first device region 106) during a second well implantation (e.g., p-type wells) process. In some embodiments, further doping implantations may be performed to form deep well implant regions within the substrate 101.

According to some embodiments, an optional anti-punch through (APT) (e.g., optional APT implantation process 150 represented by the directional arrow in FIG. 1) may be performed in order to implant anti-punch through dopants into the substrate 101. The anti-punch through dopants help to reduce or prevent the short channel effect of electrons or holes punching through from the source to the drain. The anti-punch through dopants in the first device region 106 may be doped the same as the well in the first device region 106 but with a higher dopant concentration and the anti-punch through region in the second device region 108 may be doped (in, e.g., a separate process) the same as the well in the second device region 108 but with a higher dopant concentration. Furthermore, the optional APT implantation process 150 may comprise a series of implant steps (e.g., Well-1, Well-2, and APT). According to some embodiments each implant step uses an implantation dosage into the substrate 101 with a concentration of between about 1E13/cm$^2$ and about 1.5E14/cm$^2$. However, any suitable implantation and dosage may be utilized.

Figure 2:
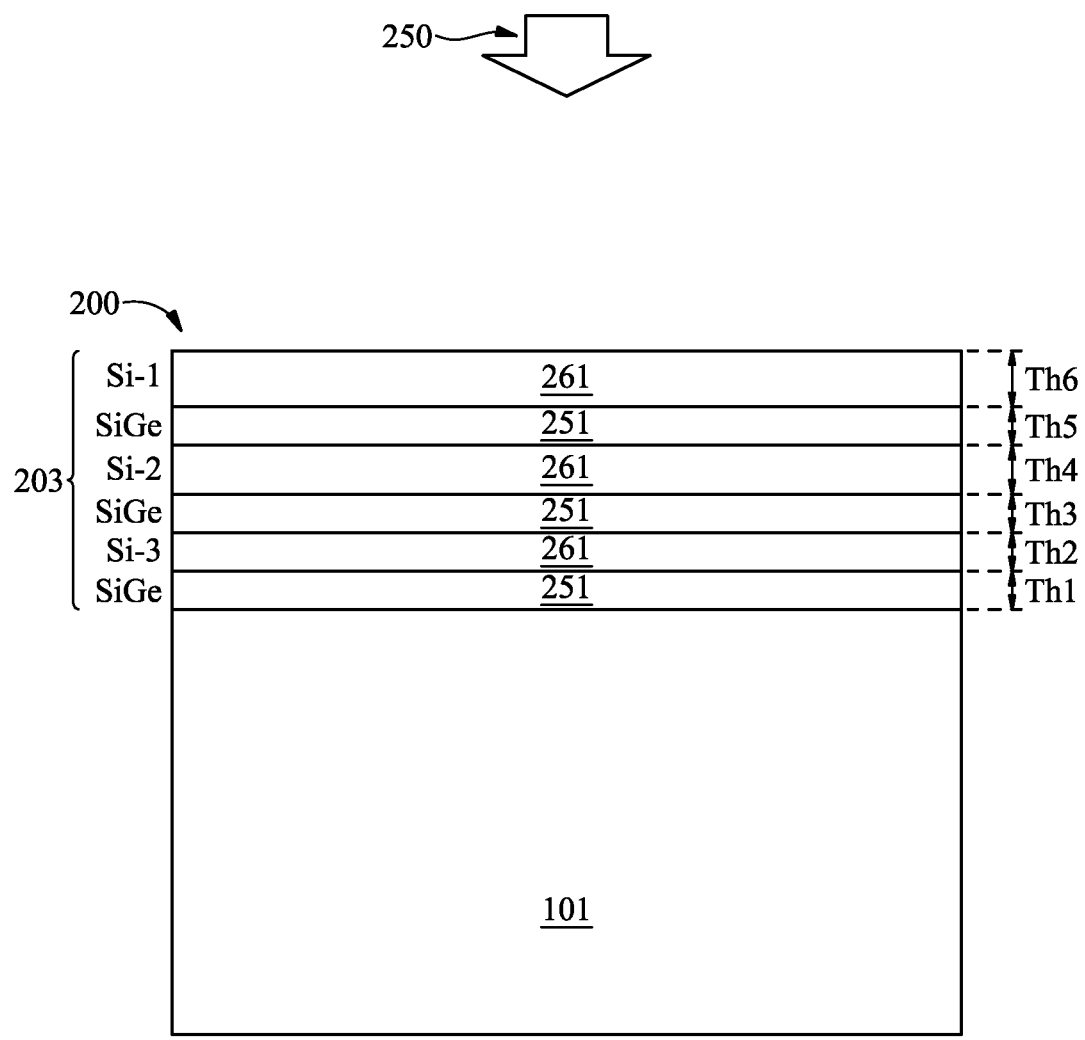

FIG. 2 is a cross-sectional view of a deposition process 250, in accordance with some embodiments, to form a multi-layer structure 200 in an intermediate stage of manufacturing the gate all-around (GAA) transistor. In particular, FIG. 2 illustrates a series of depositions that are performed to form a multi-layer stack 203 of alternating materials of first layers 251 and second layers 261 over the substrate 101.

According to some embodiments, the deposition process 250 comprises forming a first layer 251 of semiconductor material with a first lattice constant, such as SiGe, Ge, Si, GaAs, InSb, GaSb, InAlAs, InGaAs, GaSbP, GaAsSb, combinations of these, or the like. In some embodiments, the first layer 251 is epitaxially grown on the substrate 101 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 251 is formed to a first thickness Th1 of between about 6 nm and about 20 nm, such as about 10 nm. However, any suitable thickness may be utilized while remaining within the scope of the embodiments.

Once the first layer 251 has been formed over the substrate 101, the second layer 261 may be formed over the first layer 251. According to some embodiments, the second layer 261 may be a second semiconductor material such as Si, SiGe, Ge, GaAs, InSb, GaSb, InAlAs, InGaAs, GaSbP, GaAsSb, combinations of these, or the like, with a different lattice constant than the material of the first layer 251. In a particular embodiment in which the first layer 251 is silicon germanium, the second layer 261 is a material with a different lattice constant, such as silicon. However, any suitable combination of materials may be utilized.

In some embodiments, the second layer 261 is epitaxially grown on the first layer 251 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. The second layer 261 is formed to a second thickness Th2 of between about 4 nm and about 8 nm, such as about 6 nm. However, any suitable material and any suitable thickness may be used.

Once the second layer 261 has been formed over the first layer 251, the deposition process 250 is repeated to form the remaining material layers in the series of alternating materials of the first layers 251 and the second layers 261 until a desired topmost layer of the multi-layer stack 203 has been formed. In a particular embodiment, another first layer 251 is formed to a third thickness Th3, another second layer 261 is formed to a fourth thickness Th4, another first layer 251 is formed to a fifth thickness Th5, and another second layer 261 is formed to a sixth thickness Th6. According to the present embodiment, the topmost layer of the multi-layer stack 203 is formed as a second layer 261; however, in other embodiments, the topmost layer of the multi-layer stack 203 may be formed as a first layer 251. Additionally, although embodiments are disclosed herein comprising three first layers 251 and three second layers 261, the multi-layer stack 203 may have any suitable number of layers (e.g., nanosheets). For example, the multi-layer stack 203 may comprise multiple nanosheets in a range between 2 to 10 nanosheets. In some embodiments, the multi-layer stack 203 may comprise equal numbers of first layers 251 to second layers 261; however, in other embodiments, the number of first layers 251 may be different from the number of second layers 261.

According to some embodiments, the first layers 251 of the multi-layer stack 203 are formed to be substantially the same thickness (e.g., the first thickness Th1~the third thickness Th3~the fifth thickness Th5) and the thicknesses of the second layers 261 of the multi-layer stack 203 (e.g., the second thickness Th2, the fourth thickness Th4, the sixth thickness Th6) are formed to different thicknesses from one another. In some embodiments, the thicknesses (e.g., Th2, Th4, and Th6) of the second layers 261 of the multi-layer stack 203 progressively increase from a thinnest layer of the second layers 261 (e.g., Th2) to a thickest layer of the second layers 261 (e.g., Th6) as a distance from the substrate 101 increases. FIG. 2, in accordance with some embodiments, further illustrates that a topmost layer of the second layers 261 is the thickest of the second layers 261 and a bottommost layer of the second layers 261 is the thinnest of the second layers 261 (e.g., the sixth thickness Th6>the fourth thickness Th4>the second thickness Th2). According to some embodiments, the thicknesses of the second layers 261 of the multi-layer stack 203 (e.g., Th2, Th4, and Th6) progressively increase by about 1.05 times to about 1.3 times from one second layer 261 to a next second layer 261 as the distance from the substrate 101 increases. In some embodiments, a difference between thicknesses from one of the second layers 261 (e.g., Th2, Th4, and Th6) to a next one of the second layers 261 in the multi-layer stack 203 is between about 0.5 nm and about 3.0 nm, such as about 1.0 nm. However, any suitable dimensions may be used.

For example, each of the thicknesses (e.g., the first thickness Th1, the third thickness Th3, and the fifth thickness Th5) of the first layers 251 of the multi-layer stack 203 may be about the same thickness between about 6 nm and about 20 nm, such as about 10 nm, in accordance with some embodiments. Continuing with the example, each of the second layers 261 may be formed to a thickness of between about 4 nm and about 8 nm, such as about 6 nm, wherein the thicknesses of the second layers 261 (e.g., Th2, Th4, and Th6) progressively increase by about 1.05 times to about 1.3 times from one second layer to a next second layer (e.g., from Th2 to Th4, or from Th4 to Th6) as the distance from the substrate 101 increases (e.g., Th2<Th4<Th6), in accordance with some embodiments. For example, a thickness of the intermediate layer of the second layers 261 (e.g., the fourth thickness Th4) may be between about 4.5 nm and about 8.5 nm, such as about 6.5 nm, wherein the fourth thickness Th4 is between about 1.05 times to about 1.3 times the second thickness Th2. Furthermore, a thickness of the topmost layer of the second layers 261 (e.g., the sixth thickness Th6) may be between about 5 nm and about 9 nm, such as about 7 nm, wherein the sixth thickness Th6 is between about 1.05 times to about 1.3 times the fourth thickness Th4. However, any suitable thickness may be utilized.

Additionally, as described above, the well implantations and optional APT implantation process 150 may be performed prior to the epitaxial formation of the multi-layer stack 203, according to some embodiments. In other embodiments, the epitaxial formation of the multi-layer stack 203 is formed prior to performing the well implantations and the optional APT implantation process 150. Any suitable combination of processes may be utilized to form the multi-layer stack 203 and perform the well implantations and the optional APT implantation process 150 may be used, and all such combinations are fully intended to be included within the scope of the embodiments.

Figure 3:
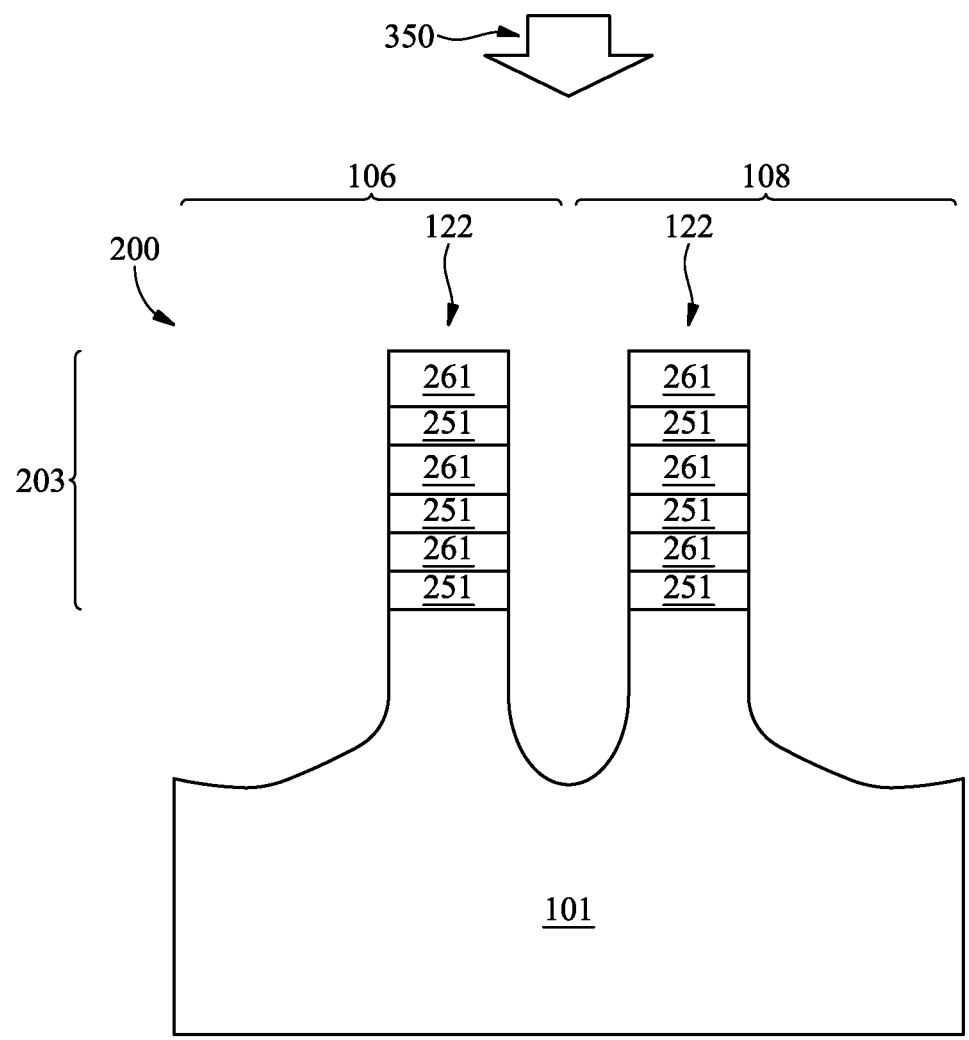

With reference now to FIG. 3, there is illustrated a patterning process 350 of the multi-layer structure 200 in an intermediate stage of manufacturing Gate All-Around (GAA) transistors, in accordance with some embodiments. In an embodiment the multi-layer stack 203 is formed from semiconductor materials that can work with the substrate 101 to help form nanostructures (e.g., nanosheets, nanowires, or the like) for the Gate All-Around (GAA) transistors. The patterning process 350, according to some embodiments, comprises applying a photoresist over the multi-layer stack 203 and then patterning and developing the photoresist to form a mask over the multi-layer stack 203. Once formed, the mask is then used during an etching process, such as an anisotropic etching process to transfer the pattern of the mask into the underlying layers and form the fins 122 in the multi-layer structure 200.

Additionally, while a single mask process has been described, this is intended to be illustrative and is not intended to be limiting, as the gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 4:
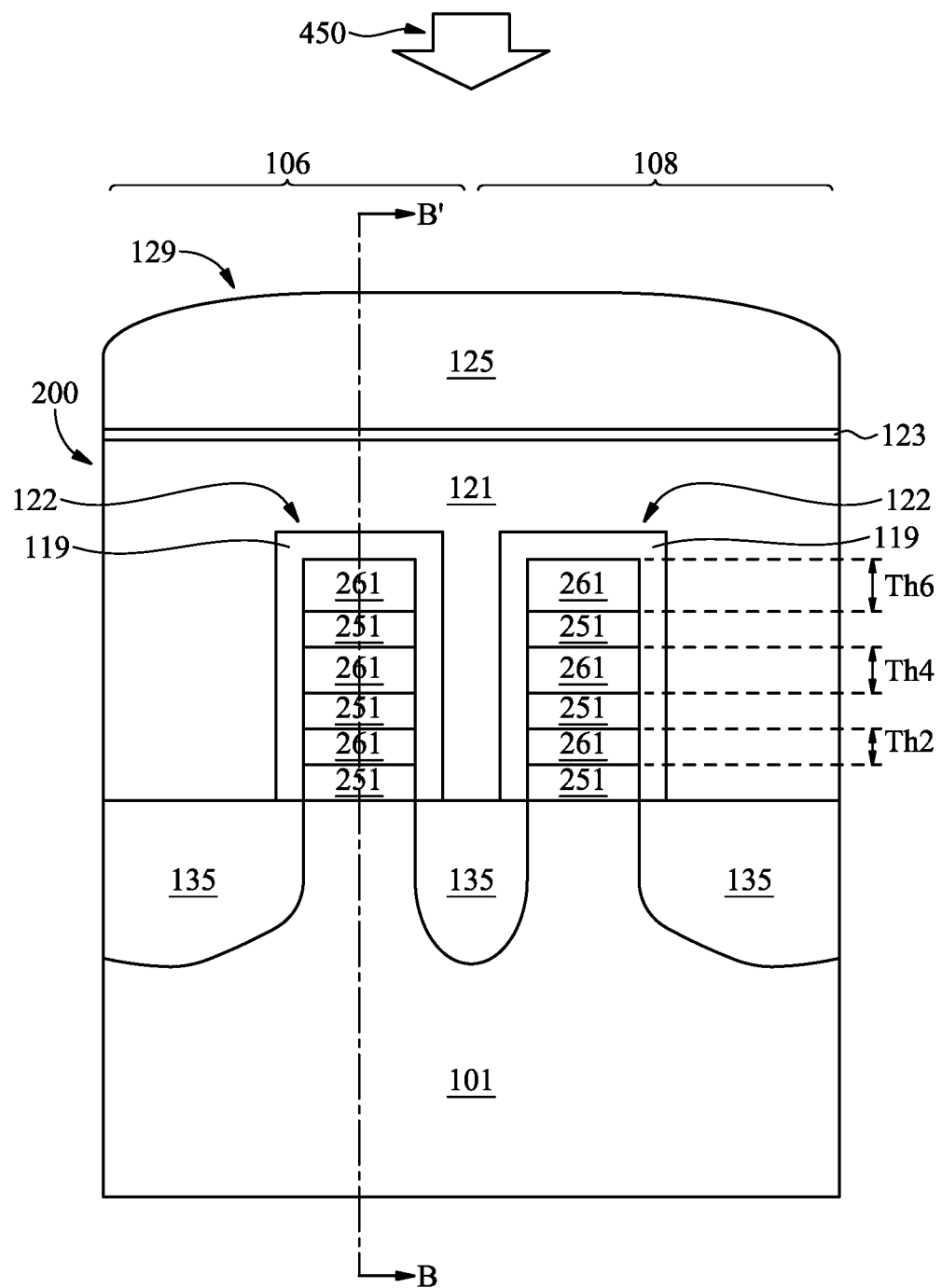

Turning to FIG. 4, after the formation of the fins 122, first isolation regions 135 are formed. In an embodiment the first isolation regions 135 may be shallow trench isolation regions formed by depositing a dielectric material such as an oxide material (e.g., a flowable oxide), high-density plasma (HDP) oxide, or the like. The dielectric material may be formed, after an optional cleaning and lining, using either a chemical vapor deposition (CVD) method (e.g., the HARP process), a high density plasma CVD method, or other suitable method of formation to fill or overfill the regions around the fins 122.

According to some embodiments, in which a flowable oxide is utilized as the dielectric material of the first isolation regions 135, a post placement anneal process 450 (e.g., oxide densification process) is performed on the multi-layer structure 200 to densify the oxide material of the first isolation regions 135 and to reduce its wet etch rate. In an embodiment, the post placement anneal process 450 may comprise one or more anneal processes (e.g., steam anneal, dry thermal anneal, diffusion-less anneal, diffusion anneal, or the like) can be performed in a furnace or in a rapid thermal processing (RTP) chamber. According to some embodiments, the post placement anneal process 450 comprises a steam anneal using steam ($H_2O$) or ($H_2O_2$) as an oxygen source at a process temperature in a range from about 500° C. to about 600° C. for a duration of between about 30 minutes and an hour. In another embodiment, the post placement anneal process 450 comprises a dry ("without steam") thermal anneal in which no steam is introduced and is performed as a low temperature dry thermal anneal using temperatures below about 750° C. In yet another embodiments, the dry thermal anneal is performed using an inert gas (e.g., $N_2$). According to some embodiments, the post placement anneal process 450 comprises a UV cure or a microwave anneal (MWA) process performed. However, any suitable annealing process may be utilized.

Once densified, excess dielectric material may be removed through a suitable process such as chemical mechanical polishing (CMP), an etch, a combination of these, or the like. In an embodiment, the removal process removes any dielectric material that is located over the fins 122 as well, so that the removal of the dielectric material will expose the surface of the fins 122 to further processing steps.

Once the dielectric material has been deposited to fill or overfill the regions around the fins 122, the dielectric material may then be recessed away from the surface of the fins 122 to form the first isolation regions 135. The recessing may be performed to expose at least a portion of the sidewalls of the fins 122 adjacent to the top surface of the fins 122. The dielectric material may be recessed using a wet etch by dipping the top surface of the fins 122 into an etchant selective to the material of the dielectric material, although other methods, such as a reactive ion etch, a dry etch, chemical oxide removal, or dry chemical clean may be used.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form the dielectric material. All of the potential process steps are fully intended to be included within the scope of the present embodiment.

FIG. 4 also illustrates the formation of a dummy gate dielectric 119 and a dummy gate electrode 121 over the fins 122. In an embodiment the dummy gate dielectric 119 may be formed by thermal oxidation, chemical vapor deposition, sputtering, or any other methods known and used in the art for forming a gate dielectric. Depending on the technique of gate dielectric formation, the dummy gate dielectric 119 thickness on the top may be different from the dummy dielectric thickness on the sidewall.

The dummy gate dielectric 119 may comprise a material such as silicon dioxide or silicon oxynitride with a thickness ranging from about 3 angstroms to about 100 angstroms, such as about 10 angstroms. In an embodiment the dummy gate dielectric 119 may be formed by first depositing a sacrificial layer of a material such as silicon in order to provide sidewall protection. Once the sacrificial layer has been formed the sacrificial material may be oxidized or nitridized and consumed in order to form a dielectric such as the silicon dioxide or silicon oxynitride. However, any suitable process may be utilized.

In other embodiments the dummy gate dielectric 119 may also be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 119.

The dummy gate electrode 121 may comprise a conductive material and may be selected from a group comprising of polysilicon, W, Al, Cu, AlCu, Ti, TiAlN, TaC, TaCN, TaSiN, Mn, Zr, TiN, Ta, TaN, Co, Ni, combinations of these, or the like. The dummy gate electrode 121 may be deposited by chemical vapor deposition (CVD), sputter deposition, or other techniques known and used in the art for depositing conductive materials. The thickness of the dummy gate electrode 121 may be in the range of about 5 Å to about 500 Å. The top surface of the dummy gate electrode 121 may have a non-planar top surface, and may be planarized prior to patterning of the dummy gate electrode 121 or gate etch. Ions may or may not be introduced into the dummy gate electrode 121 at this point. Ions may be introduced, for example, by ion implantation techniques.

Once the dummy gate dielectric 119 and the dummy gate electrode 121 have been formed, the dummy gate dielectric 119 and the dummy gate electrode 121 may be patterned. In an embodiment the patterning may be performed by initially forming a first hard mask 123 and a second hard mask 125 over the first hard mask 123. The first hard mask 123 comprises a dielectric material such as silicon oxide, silicon nitride, titanium nitride, silicon oxynitride, combinations of these, or the like. The first hard mask 123 may be formed using a process such as chemical vapor deposition, plasma enhanced chemical vapor deposition, atomic layer deposition, or the like. However, any other suitable material and method of formation may be utilized. The first hard mask 123 may be formed to a thickness of between about 20 Å and about 3000 Å, such as about 20 Å.

The second hard mask 125 comprises a separate dielectric material such as silicon nitride, silicon oxide, titanium nitride, silicon oxynitride, combinations of these, or the like. The second hard mask 125 may be formed using a process such as chemical vapor deposition, plasma enhanced chemical vapor deposition, atomic layer deposition, or the like. However, any other suitable material and method of formation may be utilized. The second hard mask 125 may be formed to a thickness of between about 20 Å and about 3000 Å, such as about 20 Å.

Once the first hard mask 123 and the second hard mask 125 have been formed, the first hard mask 123 and the second hard mask 125 may be patterned. In an embodiment the first hard mask 123 and the second hard mask 125 may be patterned by initially placing a photoresist (not individually illustrated) over the first hard mask 123 and the second hard mask 125 and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying first hard mask 123 and the second hard mask 125. In an embodiment the first hard mask 123 and the second hard mask 125 may be patterned using, e.g., one or more reactive ion etching (RIE) processes with the photoresist as a mask. The patterning process may be continued until the dummy gate electrode 121 is exposed beneath the first hard mask 123.

Once the first hard mask 123 and the second hard mask 125 have been patterned, the photoresist may be removed from the first hard mask 123 and the second hard mask 125. In an embodiment the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask 123 and the second hard mask 125 have been patterned, the dummy gate electrode 121 and the dummy gate dielectric 119 may be patterned in order to form a series of stacks 129. In an embodiment the dummy gate electrode 121 and the dummy gate dielectric 119 are patterned using an anisotropic etching process, such as a reactive ion etch, although any suitable process may be utilized.

Figure 5:
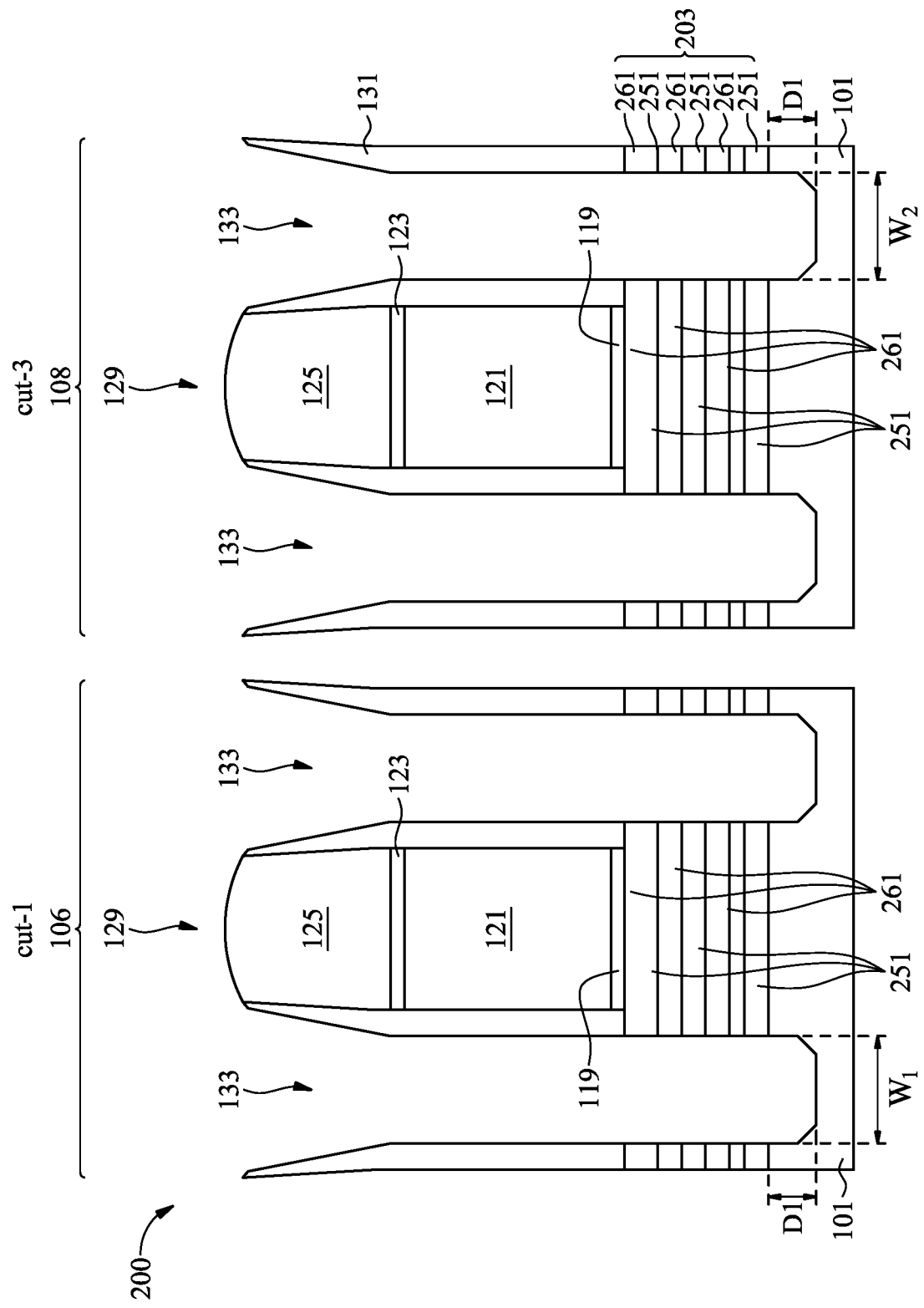

Turning to FIG. 5, this figure illustrates the cross-sectional view of the multi-layer structure 200 as taken through line B-B' of FIG. 4, in accordance with some embodiments. Additionally, while the line B-B' crosses through the first device region 106 (and, as such, the first device region 106 is illustrated in FIG. 5) for clarity a cross-sectional view of the second device region 108 is also illustrated, although the second device region 108 has been separated from the first device region 106 in FIG. 5.

FIG. 5 also illustrates the formation of first spacers 131 (e.g., top spacers). According to an embodiment, a first spacer dielectric layer may be formed over the dummy gate electrode 121 and the dummy gate dielectric 119. The first spacer dielectric layer may be formed on opposing sides of the stacks 129. The first spacer dielectric layer may be formed by blanket deposition on the multi-layer structure 200. The first spacer dielectric layer may comprise silicon oxide ($SiO_2$), silicon oxynitride (SiON), silicon nitride ($Si_3N_4$), silicon oxycarbide (SiOC), silicon oxycarbonitride (SiOCN), although any suitable material, such as low-k materials with a k-value less than about 4.0, or even an air gap, or combination thereof may be utilized. The first spacers 131 may be formed by methods utilized to form such a layer, such as chemical vapor deposition (CVD), plasma enhanced CVD, sputter, and any other suitable methods.

Once formed, the first spacer dielectric layer may be etched in order to form first spacers 131 on the stacks 129. In an embodiment the first spacers 131 may be formed using an anisotropic etching process such as a reactive ion etching (RIE) process. However, while the first spacers 131 are described using a single first spacer dielectric layer, this is intended to be illustrative and is not intended to be limiting. Rather, any number of layers and any combinations of deposition and removal processes may be used, and all such processes are fully intended to be included within the scope of the embodiments.

Additionally, during the formation of the first spacers 131, the multi-layer stack 203 will be re-exposed by the removal of the first spacer dielectric layer. Once exposed, FIG. 5 additionally illustrates an etching process to remove material from the multi-layer stack 203 and the substrate to form openings 133 which extend through the multi-layer stack 203 and into the substrate 101 in preparation for forming source/drain regions (described further below with respect to FIG. 7). In an embodiment the etching may be performed using one or more anisotropic etches, such as reactive ion etches, although any suitable processes may be utilized.

In an embodiment the openings 133 may be formed to have a first width W1 of between about 10 nm and about 40 nm, such as about 20 nm. Additionally, the openings 133 may be formed to extend into the substrate 101 a first depth D1 of between about 3 nm and about 40 nm, such as about 10 nm. However, any suitable dimensions may be utilized.

Furthermore, in some embodiments, the openings 133 formed in the second device region 108 may be patterned separately and different from the openings 133 formed in the first device region 106. As such, the openings 133 patterned in the second device region 108 may be formed to a different width and/or a different height than the openings 133 patterned in the first source/drain regions 601. For example, in some embodiments, the openings 133 patterned in the second device region 108 may be formed to a greater width or to a lesser width than the openings 133 patterned in the first device region 106 (e.g., W1) and/or may be formed to extend into the substrate 101 to a greater extent or to a lesser extent than the openings 133 patterned in the first device region 106 (e.g., D1). However, any suitable heights and/or suitable depths may be used to form the openings 133 in the second device region 108 and all such processes are fully intended to be included within the scope of the embodiments.

Figure 6:
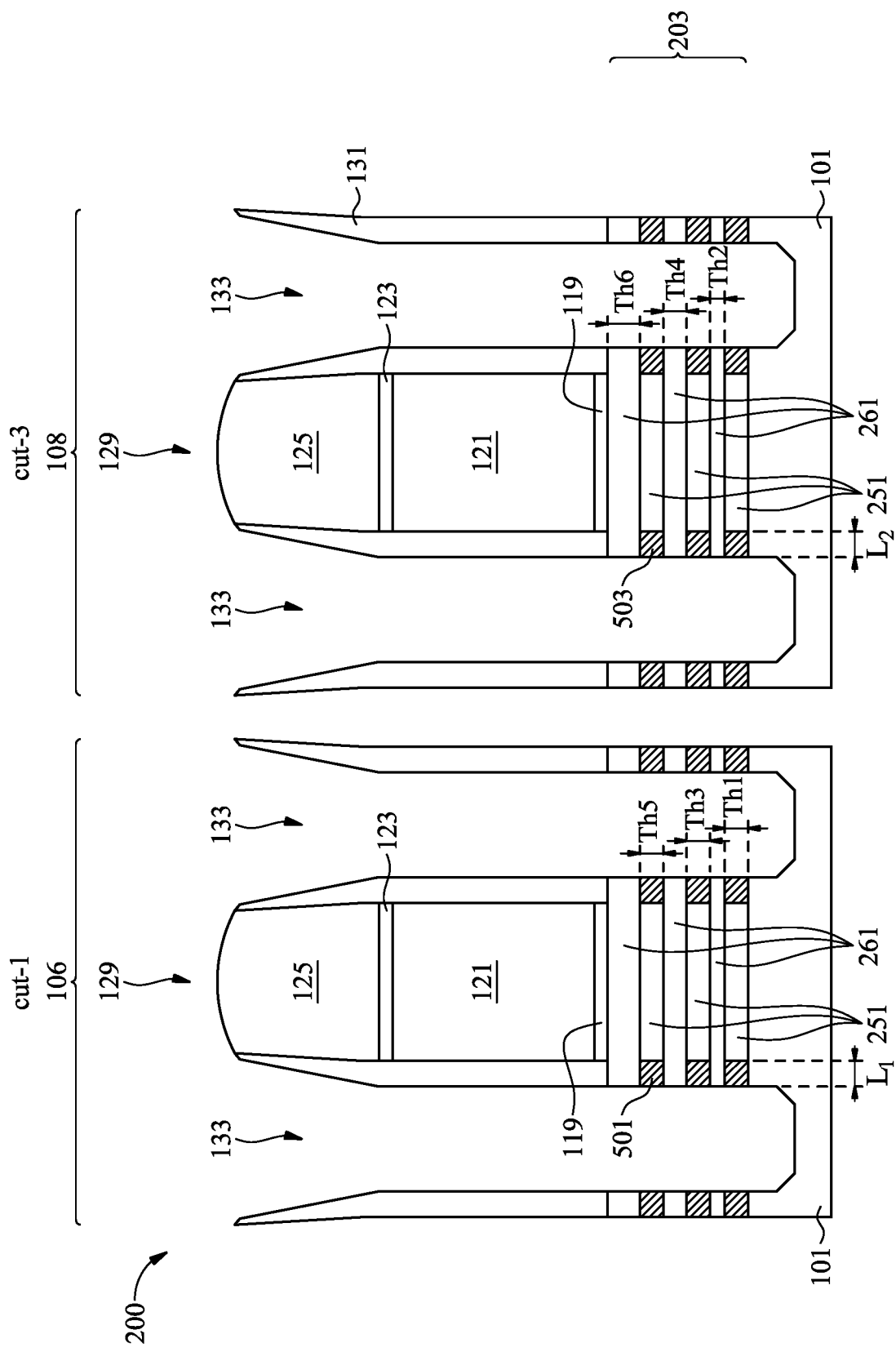

FIG. 6 illustrates formation of first inner spacers 501 in the first layers 251 of the first device region 106 and formation of second inner spacers 503 in the first layers 251 of the second device region 108. The first inner spacers 501 may be formed in the first layers 251 of the first device region 106 and the second inner spacers 503 may be formed in the first layers 251 of the second device region 108 during a same series of steps or they may be formed in different series of steps while masking one of the device regions.

In some embodiments, the first inner spacers 501 and the second inner spacers 503 are formed by patterning recesses using a wet etch with an etchant selective to the material of the first layers 251 (e.g., silicon germanium (SiGe)) without significantly removing the material of the second layers 261 (e.g., silicon) or the substrate 101 (e.g., Si). For example, in an embodiment in which the first layers 251 are silicon germanium and the second layers 261 are silicon, the wet etch may use an etchant such as hydrochloric acid (HCl).

In an embodiment the wet etching process may be a dip process, a spray process, a spin-on process, or the like. Additionally, the wet etching process may be performed at a temperature of between about 400° C. and about 600° C. and may be continued for a time of between about 100 seconds and about 1000 seconds, such as about 300 seconds. However, any suitable process conditions and parameters may be utilized. The etching process may be continued such that recesses with facet limited surfaces are formed in each of the first layers 251 to a length of between about 4 nm and about 8 nm, such as about 6 nm. However, any suitable length may be used.

In embodiments in which the first layers 251 of the first device region 106 are patterned separately from the first layers 251 of the second device region 108, the recesses formed in the first device region 106 may be patterned differently from the recesses formed in the second device region 108. For example, the recesses formed in the first device region 106 may be formed to a first length $L_1$ and the recesses formed in the second device region 108 may be formed to a second length $L_2$. The second length $L_2$ may be the same or different from the first length $L_1$ and all such processes are fully intended to be included within the scope of the embodiments.

However, a wet etching process is not the only process that may be utilized. For example, in another embodiment the patterning of the first layers 251 may be performed with an isotropic dry etching process or a combination of a dry etching process and a wet etching process. Any suitable process of patterning the first layers 251 may be utilized, and all such processes are fully intended to be included within the scope of the embodiments.

Once the recesses are formed in each of the first layers 251 in the first device region 106 and in each of the first layers 251 of the second device region 108, a spacer material is formed over both the first device region 106 and the second device region 108. In some embodiments, the spacer material can be different from the material of the first spacers 131 and can be a dielectric material comprising silicon such as silicon oxide ($SiO_2$), silicon oxynitride (SiON), silicon nitride ($Si_3N_4$), silicon oxycarbide (SiOC), silicon oxycarbonitride (SiOCN), although any suitable material such as low-k materials with a k-value less than about 4.0, or even an air gap, or combination thereof may also be utilized. The spacer material may be deposited using a deposition process such as chemical vapor deposition, physical vapor deposition, or atomic layer deposition to a thickness of between about 3 nm and about 10 nm, such as about 5 nm. However, any suitable thickness or deposition process may be utilized.

By depositing the spacer material over both the first device region 106 and the second device region 108, the spacer material will line the sidewalls of the openings 133 and will also fill in the recesses in the first layers 251 of the first device region 106 and the recesses in the first layers 251 of the second device region 108. Once the recesses have been filled with the spacer material, a removal process is then performed to remove the spacer material from the openings 133 within the first device region 106 and the openings 133 within the second device region 108, while leaving behind first inner spacers 501 in the first device region 106 and leaving behind second inner spacers 503 in the second device region 108. In an embodiment, the removal of the spacer material may be performed using an etching process such as, e.g., an anisotropic, dry etching process such as a reactive ion etching process. However, any suitable etching process, which removes the spacer material from the openings 133 while leaving behind the first inner spacers 501 and the second inner spacers 503, may be utilized.

As such, the first inner spacers 501 will take on the shape of the first recesses and the second inner spacers 503 will take on the shape of the second recesses. Additionally, while an embodiment forming the first inner spacers 501 and the second inner spacers 503 to faceted shapes is described, this is intended to be illustrative and is not intended to be limited. Rather, any suitable shape, such as a concave shape or a convex shape, or even the first inner spacers 501 and the second inner spacers 503 being recessed may be utilized. All such shapes are fully intended to be included within the scope of the embodiments.

Figure 7:
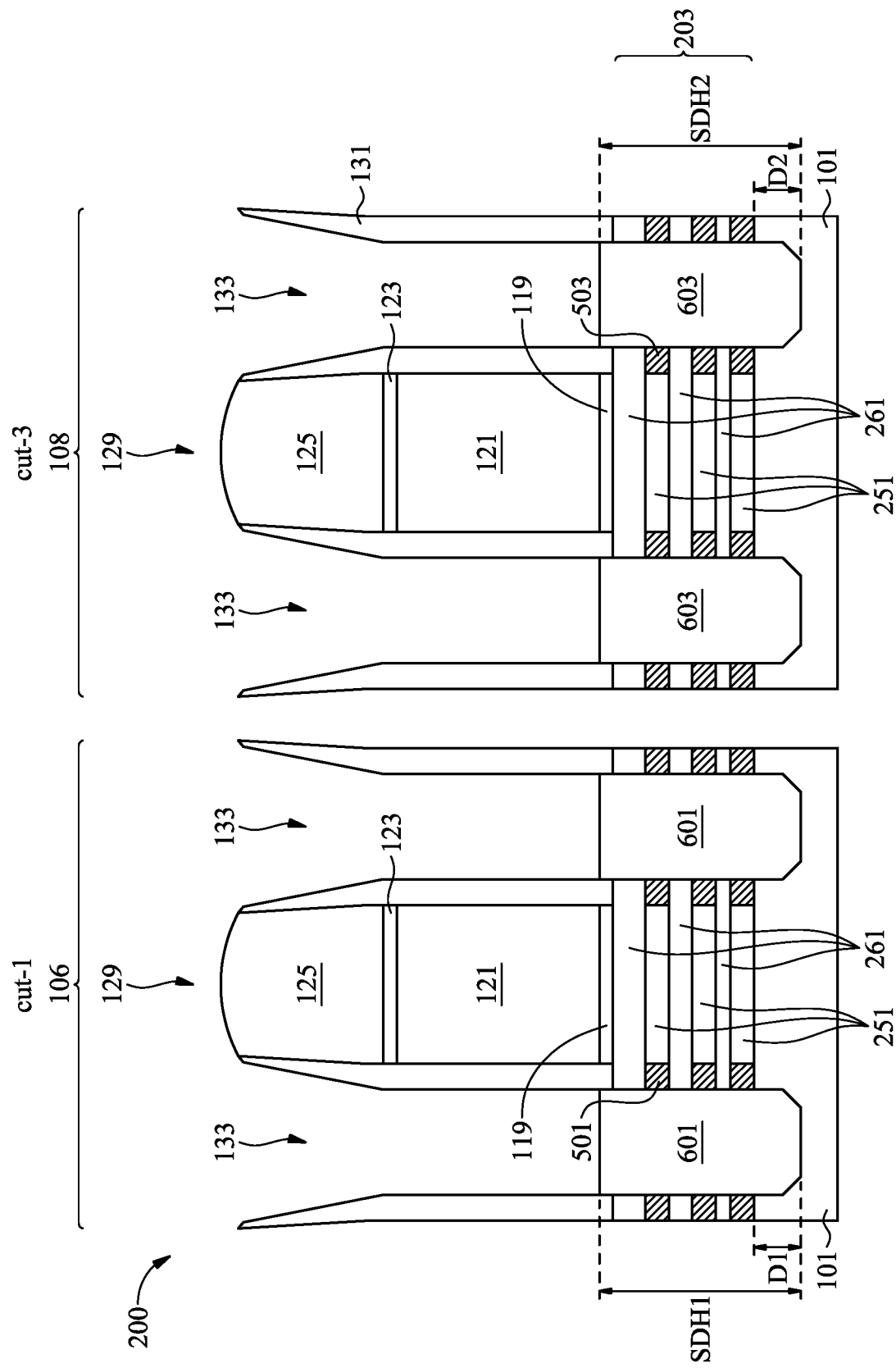

FIG. 7 illustrates formation of first source/drain regions 601 within the first device region 106 and second source/drain regions 603 within the second device region 108. In an embodiment the first source/drain regions 601 may be formed by initially protecting the second device region 108 with, for example, a photoresist or other masking materials. Once the second device region 108 has been protected, the first source/drain regions 601 may be formed using a growth process such as a selective epitaxial process with a semiconductor material suitable for the device desired to be formed. For example, in an embodiment in which the first source/drain regions 601 are utilized to form an NMOS device, the first source/drain regions 601 may be a semiconductor material such as silicon, silicon phosphorous, silicon carbon phosphorous, combinations, of these, or the like. The epitaxial growth process may use precursors such as silane, dichlorosilane, germane, and the like, and may continue for between about 5 minutes and about 120 minutes, such as about 30 minutes. According to some embodiments, the first source/drain regions 601 are formed to a first source/drain height SDH1 of between about 30 nm and about 90 nm, such as about 60 nm and extend into the substrate 101 the first depth D1. However, any suitable heights and/or suitable depths may be used.

Once the first source/drain regions 601 are formed, dopants may be implanted into the first source/drain regions 601 by implanting appropriate dopants to complement the dopants within the remainder of the first device region 106. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices. These dopants may be implanted using the stacks 129 and the first spacers 131 as masks.

In another embodiment, the dopants of the first source/drain regions 601 may be placed during the growth of the first source/drain regions 601. For example, phosphorous may be placed in situ as the first source/drain regions 601 are being formed. Any suitable process for placing the dopants within the first source/drain regions 601 may be utilized, and all such processes are fully intended to be included within the scope of the embodiments. Furthermore, an anneal process may be performed to activate the dopants within the first source/drain regions 601. During the anneal process, dopants of the first source/drain regions 601 may laterally diffuse into the second layers 261 at the interfaces between the second layers 261 and the first source/drain regions 601. As such, lightly doped drain (LDD) regions may be formed within the second layers 261 of the first device region 106.

Once the first source/drain regions 601 have been formed, the second source/drain regions 603 may be formed by removing the protection from the second device region 108 (through, e.g., a process such as ashing) and protecting the first device region 106 with, for example, a photoresist or other masking material. Once the first device region 106 has been protected, the second source/drain regions 603 may be formed of materials comprising silicon (Si), silicon germanium (SiGe), silicon germanium carbon (SiGeC), germanium (Ge), or combinations thereof. The second source/drain regions 603 may be formed using a process such as epitaxial growth, although any suitable material or process may be utilized.

FIG. 7 further illustrates that the second source/drain regions 603 are formed to a second source/drain height (e.g., SDH2) and a second depth (e.g., D2). The second source/drain regions 603 may be formed to a same height and/or a same depth as the first source/drain regions 601, although the heights and/or depths may be different from those of the first source/drain regions 601 and all such processes are fully intended to be included within the scope of the embodiments. According to some embodiments, the second source/drain regions 603 are formed to a second source/drain height SDH2 of between about 30 nm and about 90 nm, such as about 60 nm and extend into the substrate 101 a second depth D2 of between about 3 nm and about 40 nm, such as about 10 nm. However, any suitable heights and/or suitable depths may be used.

Additionally, either during the growth process or after the growth process, dopants may be implanted within the second source/drain regions 603 by implanting appropriate dopants to complement the dopants within the remainder of the second device region 108. For example, p-type dopants such as boron may be placed within the second source/drain regions 603. These dopants may be implanted using the stacks 129 and the first spacers 131 as masks. For example, the dopants may be implanted after formation using an ion implantation process, or else may be deposited in situ with the formation of the second source/drain regions 603. An anneal process may be performed to activate the dopants within second source/drain regions 603. During the anneal process, dopants of the second source/drain regions 603 may laterally diffuse into the second layers 261 at the interfaces between the second layers 261 and the second source/drain regions 603. As such, lightly doped drain (LDD) regions may be formed within the second layers 261 of the second device region 108. Additionally, once the second source/drain regions 603 have been formed, the protection of the first device region 106 may be removed using a process such as ashing.

Figure 8:
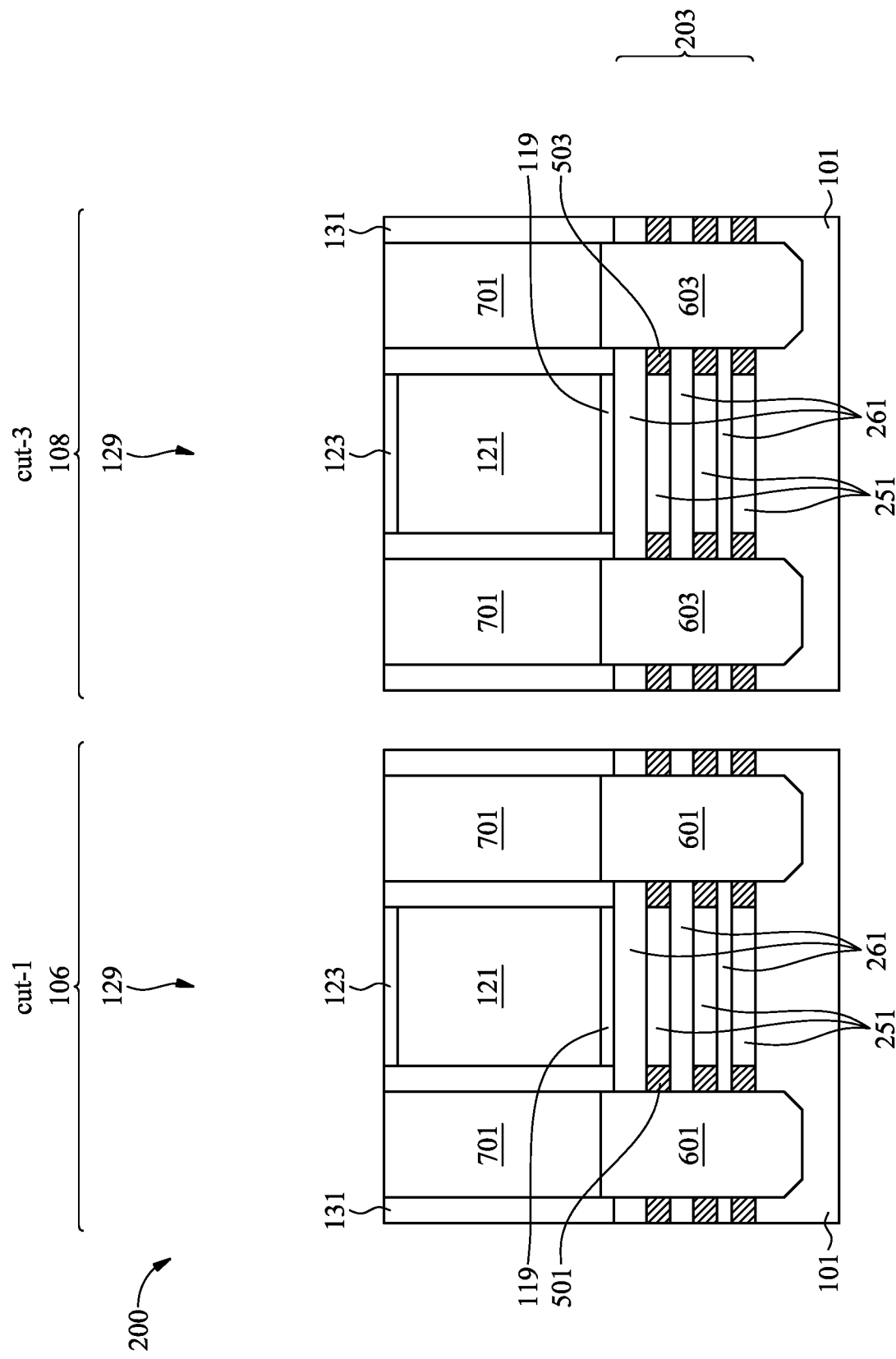

FIG. 8 illustrates a formation of a first inter-layer dielectric (ILD) (e.g., first ILD layer 701) over the first device region 106 and the second device region 108. The first ILD layer 701 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof, although any suitable dielectrics may be used. The first ILD layer 701 may be formed using a process such as PECVD, although other processes, such as LPCVD, may alternatively be used.

Additionally, if desired, gate end dielectrics 1325 (not illustrated in FIG. 8 but illustrated below with respect to FIG. 12A) may be formed. In an embodiment, portions of the dummy gate electrode 121 are removed using, e.g., a masking and etching process in order to cut the dummy gate electrode 121 into separate sections. Once the material has been cut, material for the gate end dielectrics 1325 such as silicon nitride, silicon oxide, titanium nitride, silicon oxynitride, combinations of these, or the like, is deposited and planarized in order to form the gate end dielectrics 1325 and separate the materials of the dummy gate electrode 121.

Once the first ILD layer 701 has been deposited and any gate end dielectrics 1325 have been formed, the first ILD layer 701 and gate end dielectrics 1325 may be planarized with the first spacers 131 using, e.g., a planarization process such as a chemical mechanical polishing process, although any suitable process may be utilized. Additionally, the planarization process can also remove the second hard mask 125 while stopping on the first hard mask 123.

Figure 9:
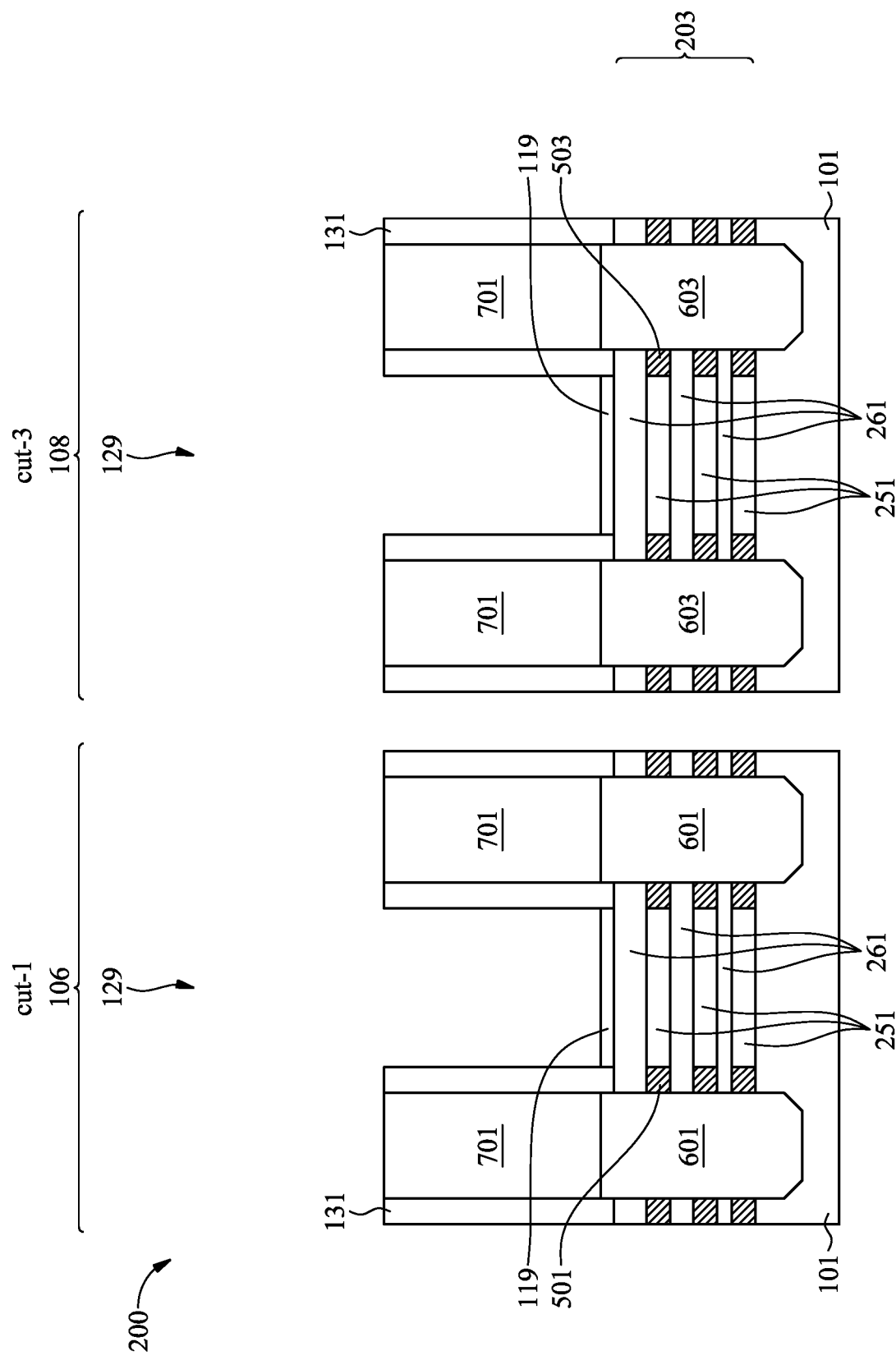

FIG. 9 illustrates a removal of the first hard mask 123 as well as a removal of the dummy gate electrode 121. In an embodiment the first hard mask 123 may be removed using an etching process or a planarization process (e.g., a continuation of the previous chemical mechanical polishing process) to remove the material of the first hard mask 123. However, any suitable method of removing the first hard mask 123 to expose the material of the dummy gate electrode 121 may be utilized.

Once the dummy gate electrode 121 has been exposed, the dummy gate electrode 121 may be removed in order to expose the underlying dummy gate dielectric 119. In an embodiment the dummy gate electrode 121 may be removed using, e.g., one or more wet or dry etching process that utilizes etchants that are selective to the material of the dummy gate electrode 121. However, any suitable removal process may be utilized.

Figure 10A:
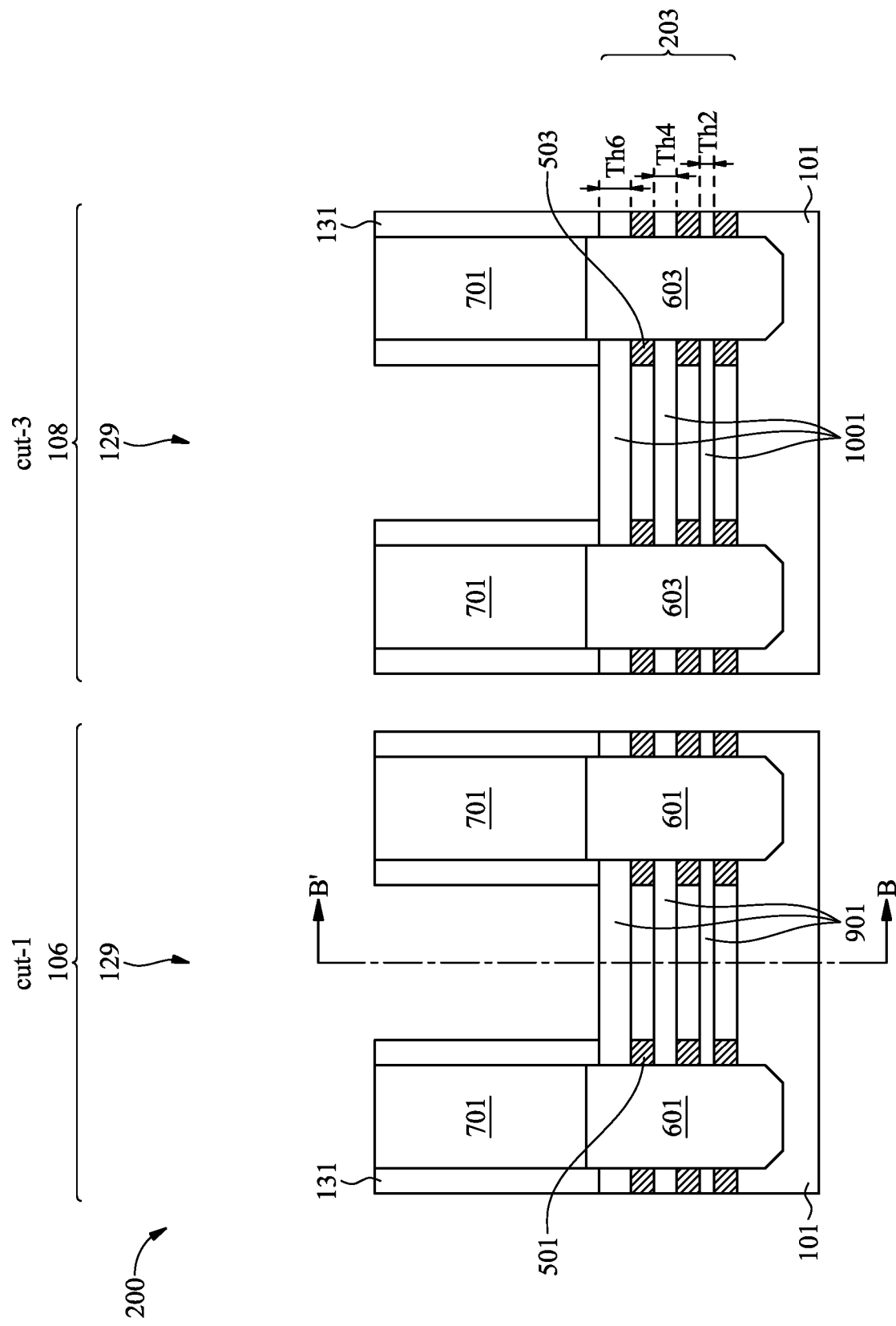

FIG. 10A illustrates that, once the dummy gate dielectric 119 has been exposed, the dummy gate dielectric 119 within the first device region 106 and the second device region 108 may be removed in a wire release process step. The wire release process step may also be referred to as a sheet release process step, a sheet formation process step, a nanosheet formation process step or a wire formation process step. In an embodiment the dummy gate dielectric 119 may be removed using, e.g., a wet etching process, although any suitable etching process may be utilized.

FIG. 10A further shows that, once the dummy gate dielectric 119 has been removed (which also exposes the sides of the first layers 251), the first layers 251 may be removed from between the substrate 101 and from between the second layers 261 within both the first device region 106 and the second device region 108. In an embodiment the first layers 251 may be removed using a wet etching process that selectively removes the material of the first layers 251 (e.g., silicon germanium (SiGe)) without significantly removing the material of the substrate 101 and the material of the second layers 261 (e.g., silicon (Si)). However, any suitable removal process may be utilized.

For example, in an embodiment in which the material of the first layers 251 is silicon germanium (SiGe) and the material of the second layers 261 is silicon, the removal of the first layers 251 may be performed using an etchant that selectively removes the material of the first layers 251 (e.g., silicon germanium) without substantively removing the material of the second layers 261 (e.g., silicon). In an embodiment, the etchant may be a high temperature HCl. Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 251, the material of the second layers 261 (e.g., nanosheets) are formed into first nanostructures 901 within the first device region 106 separated from each other by the first inner spacers 501 and formed into second nanostructures 1001 within the second device region 108 separated from each other by the second inner spacers 503. The first nanostructures 901 comprise the channel regions of the first device region 106 that stretch between opposite ones of the first source/drain regions 601 within the first device region 106 and the second nanostructures 1001 comprise the channel regions of the second device region 108 that stretch between opposite ones of the second source/drain regions 603. In an embodiment the first nanostructures 901 and the second nanostructures 1001 are formed to have same or thinner thicknesses as the original thicknesses of the second layers 261, such as having the second thickness Th2, the fourth thickness Th4, the sixth thickness Th6, although the etching processes may also be utilized to reduce the thicknesses. In addition, in accordance with embodiments where the topmost layer of the first layers 251 is formed to between about 1.05 times to about 1.3 times the thickness of the intermediate layer of the first layers 251 (e.g., Th4) of the multi-layer stack 203, a topmost nanostructure of the first nanostructures 901 (e.g., Th6) is between about 1.05 times to about 1.3 times the thickness of an intermediate nanostructure (e.g., Th4) of the first nanostructures 901 and a topmost nanostructure of the second nanostructures 1001 (e.g., Th6) is between about 1.05 times to about 1.3 times the thickness of an intermediate nanostructure (e.g., Th4) of the second nanostructures 1001.

In some embodiments, the wire release step may include an optional step for the partial removal of the material of the second layers 261 (e.g., by over etching) during removal of the first layers 251. As such, the thickness of first nanostructures 901 and the second nanostructures 1001 are formed to have reduced thicknesses as compared to the original thickness of the second layers 261 (e.g., the second thickness Th2, the fourth thickness Th4, the sixth thickness Th6). During such a partial removal, the first spacers 131, first inner spacers 501, and second inner spacers 503 may serve to protect adjacent material of the second layers 261 from being removed. As such, the thicknesses of the first nanostructures 901 and second nanostructures 1001 at distal end portions of the nanostructures and, hence the lightly doped drain LDD regions of the nanostructures, are protected during the wire release step and remain the original thicknesses of the second layers 261. According to some embodiments, middle portions of the first nanostructures 901 and middle portions of the second nanostructures 1001 may have reduced thicknesses of between about 4 nm and about 8 nm, such as about 5.5 nm and LDD regions of the first nanostructures 901 and LDD regions of the second nanostructures 1001 may have thicknesses of between about 5 nm and about 10 nm, such as about 7.5 nm. However, any suitable thicknesses may be used.

Additionally, although FIG. 10A illustrates the formation of three of the first nanostructures 901 and three of the second nanostructures 1001, any suitable number of the first nanostructures 901 may be formed from the nanosheets provided in the multi-layer stack 203. For example, the multi-layer stack 203 may be formed to include any suitable number of first layers 251 (e.g., first nanosheets) and any suitable number of second layers 261 (e.g., second nanosheets). As such, a multi-layer stack 203 comprising fewer first layers 251 and fewer second layers 261, after removal of the first layers 251, forms one or two of the first nanostructures 901 and the second nanostructures 1001. Whereas, a multi-layer stack 203 comprising many of the first layers 251 and many of the second layers 261, after removal of the first layers 251, forms four or more of the first nanostructures 901 and the second nanostructures 1001.

Figure 10B:
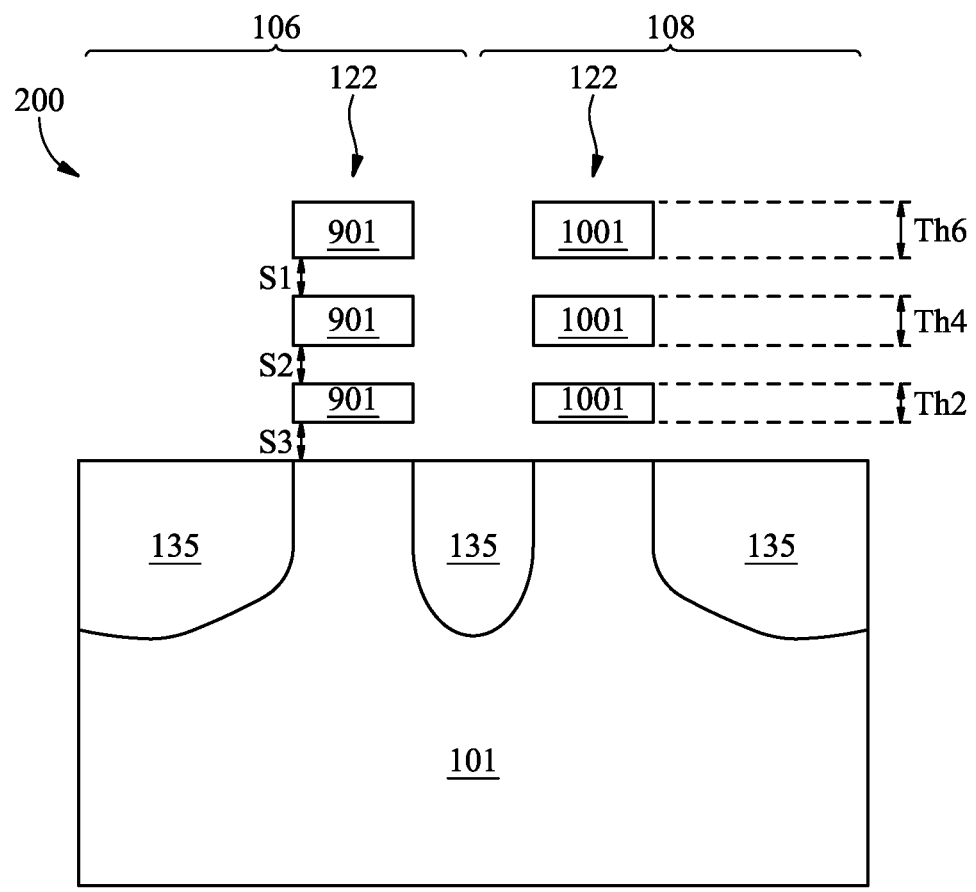

FIG. 10B illustrates a cross-sectional view of the first device region 106 along line B-B' in FIG. 10A and similar to the view of FIG. 3. As can be seen, with the removal of the dummy gate dielectric 119, the sides of the second layers 261 (relabeled within FIG. 10B to the first nanostructures 901) within the first device region 106 are exposed and the sides of the second layers 261 (relabeled within FIG. 10B to the second nanostructures 1001) within the second device region 108 are exposed. As such, the first layers 251 may be exposed to the etchant and removed from between the substrate 101 and the second layers 261 in order to form the first nanostructures 901 in the first device region 106 and the second nanostructures 1001 in the second device region 108.

Figure 11:
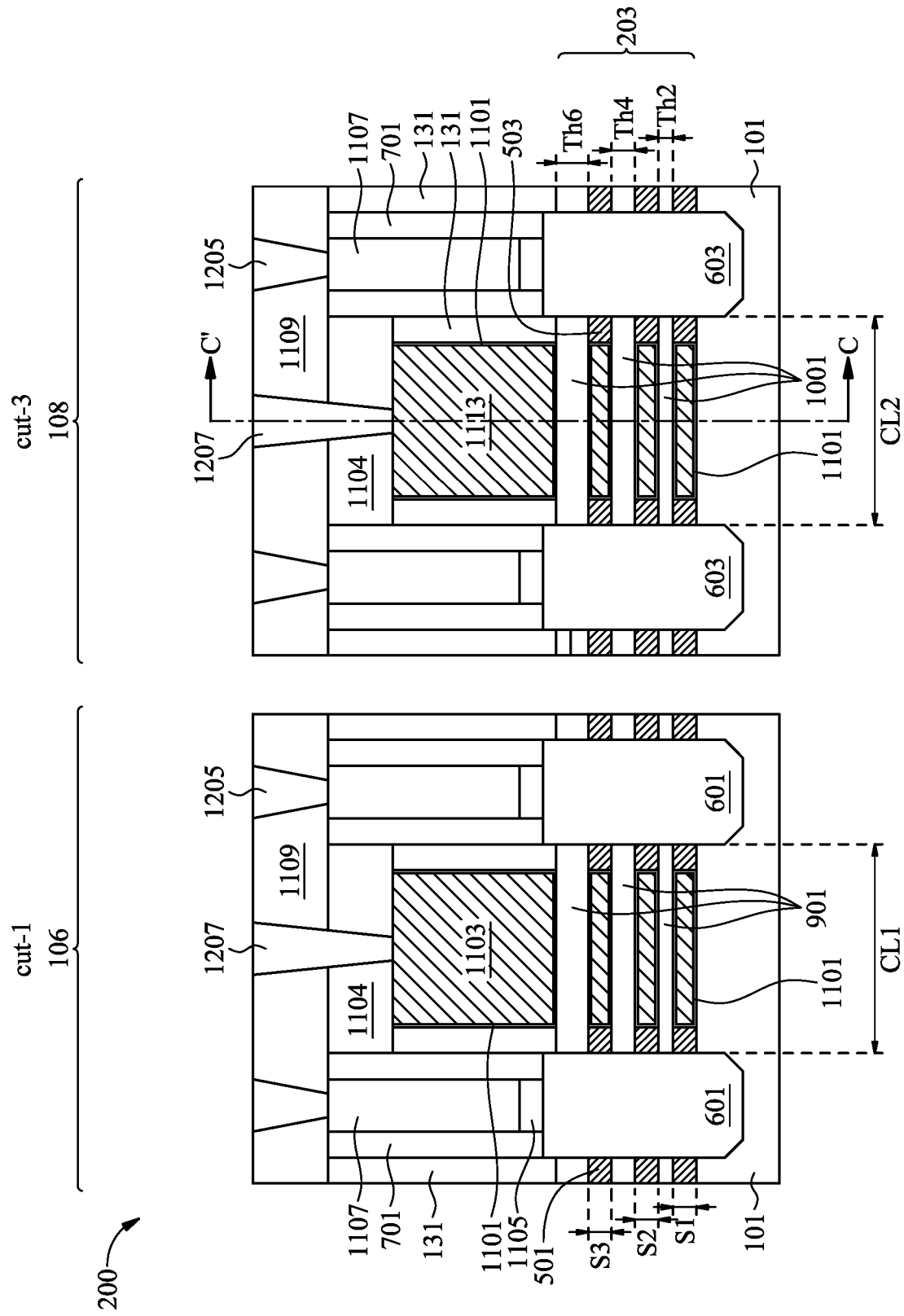

FIG. 11 illustrates the formation of gate stacks which comprise gate dielectrics and gate electrodes. For example, FIG. 11 illustrates formation of a gate dielectric 1101, a first gate electrode 1103, and source/drain contacts 1107 within the first device region 106, in accordance with some embodiments. FIG. 11 further illustrates the formation of the gate dielectric 1101, a second gate electrode 1113, and source/drain contacts 1107 formed within the second device region 108, in accordance with some embodiments.

Once the first nanostructures 901 and the second nanostructures 1001 have been exposed, the gate dielectric 1101 may be formed around the first nanostructures 901 and around the second nanostructures 1001, in accordance with some embodiments. In some embodiments, an optional first interface layer (not separately illustrated) may be formed around the first nanostructures 901 in the first device region 106 and around the second nanostructures 1001 in the second device region 108, prior to the formation of the gate dielectric 1101. In some embodiments, the first interface layer comprises a buffer material such as silicon oxide, although any suitable material may be utilized. The first interface layer may be formed around the first nanostructures 901 in the first device region 106 and the second nanostructures 1001 in the second device region 108 using a process such as CVD, PVD, or even oxidation to a thickness of between about 1 Å and about 20 Å, such as about 9 Å. However, any suitable process or thicknesses may be utilized.

In an embodiment the gate dielectric 1101 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 1101 comprises a nitrogen doped oxide dielectric that is initially formed prior to forming a metal content high-K (e.g., K value>13) dielectric material. The gate dielectric 1101 may be deposited to a thickness of between about 1 nm and about 3 nm, although any suitable material and thickness may be utilized. As illustrated, the gate dielectric 1101 wraps around the first nanostructures 901, thus forming channel regions of the first device region 106 and the gate dielectric 1101 wraps around the second nanostructures 1001, thus forming channel regions of the second device region 108.

According to some embodiments, the thicknesses for the first nanostructures 901 and the second nanostructures 1001 are thinner than the original thicknesses of the second layers 261 (e.g., Si) by about 0.3 nm and about 2 nm. During the wire release process step and during the formation of the gate dielectric layer 1101, the thicknesses of each of the second layers 261 may experience some Si material loss and/or oxidation. As such, each of the first nanostructures 901 and the second nanostructures 1001 and, hence the channel regions of the first device region 106 and the second device region 108, are formed to a thickness of between about 4 nm and about 8 nm, such as about 5 nm or thinner for the bottommost nanostructures and about 6 nm or thinner for the topmost nanostructures.

FIG. 11 further illustrates that the first gate electrode 1103 is formed to surround the first nanostructures 901 within the first device region 106. In an embodiment the first gate electrode 1103 is formed using multiple layers, each layer deposited sequentially adjacent to each other using a highly conformal deposition process such as atomic layer deposition, although any suitable deposition process may be utilized. According to some embodiments, the first gate electrode 1103 may comprise a capping layer, a barrier layer, an n-metal work function layer, a p-metal work function layer, and a fill material.

The capping layer may be formed adjacent to the gate dielectric 1101 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

FIG. 11 further illustrates that the second gate electrode 1113 is formed to surround the second nanostructures 1001 within the second device region 108 and may be formed using multiple layers, each layer deposited sequentially adjacent to each other using a highly conformal deposition process such as atomic layer deposition, although any suitable deposition process may be utilized. In an embodiment the second gate electrode 1113 may be formed using the capping layer, the barrier layer adjacent to the capping layer, the p-metal work function layer adjacent to the barrier layer, the n-metal work function layer adjacent to the p-metal work function layer, and the fill material.

According to some embodiments, one or more of the layers within the first gate electrode 1103 and the second gate electrode 1113 may be formed during a same series of steps. For example, the capping layers and the barrier layers in both of the first gate electrode 1103 and the second gate electrode 1113 may be formed simultaneously, while other layers such as the n-metal work function layer and the p-metal work function layer may be formed and/or patterned independently of each other. Any suitable combination of depositions and removals may be utilized to form the first gate electrode 1103 and the second gate electrode 1113.

Once the openings left behind by the removal of the dummy gate electrode 121 have been filled, the materials of the first gate electrode 1103 and the second gate electrode 1113 may be planarized in order to remove any material that is outside of the openings left behind by the removal of the dummy gate electrode 121. In a particular embodiment the removal may be performed using a planarization process such as chemical mechanical polishing. However, any suitable planarization and removal process may be utilized.

FIG. 11 further illustrates that the gate stack of the gate dielectric 1101 and the first gate electrode 1103 (including any interfacial layers), have a first sheet distance S1 adjacent to the substrate 101, a second sheet distance S2 between a bottommost nanostructure of the first nanostructures 901 and an intermediate nanostructure of the first nanostructures 901, and a third sheet distance S3 between the intermediate nanostructure of the first nanostructures 901 and a topmost nanostructure of the first nanostructures 901. The first sheet distance S1, the second sheet distance S2 and the third sheet distance S3 are equal to the original thicknesses of the first layers 251 such as the first thickness Th1, the third thickness Th3, and the fifth thickness Th5. In embodiments, where the first layers 251 are formed to substantially the same thickness, the first sheet distance S1, the second sheet distance S2 and the third sheet distance S3 are also formed to substantially the same thickness (e.g., S1~S2~S3). In such embodiments, the first sheet distance S1, the second sheet distance S2 and the third sheet distance S3 are formed to substantially a same distance between about 4 nm and about 15 nm, such as about 10 nm. However, any suitable distances may be utilized.

Furthermore, the first nanostructures 901 and, hence the channels of the NMOS device, and the second nanostructures 1001 and, hence the channels of the PMOS device, are formed from the second layers 261. As such, each of the first nanostructures 901 and the second nanostructures 1001 may have same thicknesses of the original thicknesses of the second layers 261, such as the second thickness Th2, the fourth thickness Th4, and the sixth thickness Th6. In embodiments where the original thicknesses of the second layers 261 are formed to thicknesses between about 4 nm and about 8 nm, the first nanostructures 901 and the second nanostructures 1001 have thicknesses of between about 4 nm and about 8 nm. Furthermore, in embodiments where distal end portions of the first nanostructures 901 and the second nanostructures 1001 are protected by either the upper spacers and/or inner spacers during the wire release step, the distal end portions and, hence the LDD regions of the nanostructures, retain the original thicknesses of the second layers 261 while thicknesses of the middle portions of the nanostructures may be reduced (e.g., due to over etching). As such, the distal ends of the first nanostructures 901 and the second nanostructures 1001 and, hence the LDD regions of the nanostructures, are formed to thicknesses between about 4 nm and about 8 nm. Additionally, the first nanostructures 901 (after formation of the first source/drain regions 601, may have a first channel length CL1 and the second nanostructures 1001 (after formation of the second source/drain regions 603, may have a second channel length CL2. In some embodiments, the second channel length CL2 is different from the first channel length CL1, although they may also be the same. According to some embodiments, the first channel length CL1 and the second channel length CL2 are between about 3 nm and about 30 nm, such as about 12 nm. However, any suitable dimensions may be utilized.

Finally, in embodiments where the original thickness of the topmost layer of the second layers 261 is formed between about 1.05 times to about 1.3 times the thickness of the intermediate layer of the second layers 261, a topmost nanostructure of the first nanostructures 901 and a topmost nanostructure of the second nanostructures 1001 have thicknesses that are between about 1.05 times to about 1.3 times the thicknesses of the intermediate layer of the first nanostructures 901 and the intermediate layer of the second nanostructures 1001, respectively. Furthermore, in embodiments where distal end portions of the first nanostructures 901 and the second nanostructures 1001 are protected by either the first spacers 131, the first inner spacers 501, and/or the second inner spacers 503 during the wire release step, the distal end portions and, hence the LDD regions of the nanostructures, retain the original thicknesses of the second layers 261, whereas thicknesses of the middle portions of the nanostructures may be reduced (e.g., due to over etching). As such, a distal end portion of a topmost nanostructure of the first nanostructures 901 and a distal end portion of a topmost nanostructure of the second nanostructures 1001 and, hence the LDD regions of the nanostructures, are formed to thicknesses that are between about 1.05 times to about 1.3 times the thicknesses of a distal end portion of an intermediate nanostructure of the first nanostructures 901 and a distal end portion of an intermediate layer of the second nanostructures 1001, respectively. However, any suitable dimensions may be utilized.

According to some embodiments, once the first gate electrode 1103 and the second gate electrode 1113 have been formed, the materials of the first gate electrode 1103, the second gate electrode 1113, and the first spacers 131 may be recessed below the planarized surfaces of the first ILD layer 701. Once recessed, a dielectric capping layer 1104 may be formed within the recesses and then planarized with the first ILD layer 701. In an embodiment the dielectric capping layer 1104 may be a dielectric material such as a silicon nitride layer or a high-k dielectric layer formed using a deposition process such as CVD, ALD, PVD, combinations of these, or the like. Once formed, the dielectric capping layer 1104 may be planarized using a planarization process such as a chemical mechanical polishing process.

FIG. 11 also illustrates that, once the first gate electrode 1103 has been formed, silicide contacts 1105 and source/drain contacts 1107 may be formed through the first ILD layer 701 to make electrical connection to the first source/drain regions 601 in the first device region 106 and the second source/drain regions 603 in the second device region 108. In an embodiment the silicide contacts 1105 and the source/drain contacts 1107 may be formed by initially forming openings through the first ILD layer 701 in order to expose the first source/drain regions 601 in the first device region 106 and the second source/drain regions 603 in the second device region 108. The openings may be formed using, e.g., a suitable photolithographic masking and etching process.

The silicide contacts 1105 may comprise titanium, nickel, cobalt, or erbium in order to reduce the Schottky barrier height of the source/drain contacts 1107. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contacts 1105 may be between about 5 nm and about 50 nm. However, any suitable thickness may be used.

In an embodiment the source/drain contacts 1107 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

Once the source/drain contacts 1107 have been formed, a second ILD layer 1109 may be formed by depositing a dielectric material over the first device region 106 and the second device region 108. The second ILD layer 1109 may be formed and planarized using any of the processes and materials suitable for forming the first ILD layer 701, as set forth above.

Additionally, after formation, source/drain vias 1205 and gate vias 1207 may be formed through the second ILD layer 1109 and the dielectric capping layer 1104 to provide electrical connectivity. In an embodiment the source/drain vias 1205 and the gate vias 1207 may be utilized by initially forming an opening through the second ILD layer 1109 and the dielectric capping layer 1104 using, e.g., a masking and etching process. Once the openings have been formed, conductive material, such as copper, may be deposited to fill and/or overfill the openings using a deposition process such as plating, chemical vapor deposition, sputtering, combinations of these, or the like. Excess material may then be removed using, for example, a planarization process such as chemical mechanical planarization, or the like.

By forming and utilizing the first nanostructures 901 within the first device region 106 and the second nanostructures 1001 within the second device region 108, high performance may be achieved with short channel devices. For example, according to some embodiments, a GAA device structure comprising multiple channel thicknesses allows for a topmost channel (e.g., channel closest to a gate top or closest to a gate contact) in the GAA device to mitigate top channel current crowding issues. For example, with the topmost channel having a vertical sheet thickness that is greater than the vertical sheet thicknesses of the other channels of the GAA device structure, a lower resistance is provided at the channel to source/drain interface of the topmost channel as compared to the resistances provided at the interfaces of the other channels. Furthermore, vertical sheet thicknesses of LDD portions of the topmost channel may have a vertical sheet thickness that is greater than the vertical sheet thicknesses of the LDD portions of the other channels of the GAA device structure. As such, top channel current crowding issues are mitigated. Furthermore, the multiple channel thicknesses within a multiple thickness sheet device structure also allows for tuning of the On-current ($I_{ON}$) and drain induced barrier loading (DIBL) to be performed through the device structure. In addition, source/drain regions may be formed deeper into the substrate which provides more volume to allow enhanced source/drain strain effects to be performed. As such, a GAA device with improved On-current ($I_{ON}$) performance as well as increased connection margin for the source/drain to bottom sheet ends is achieved.

Figure 12A:
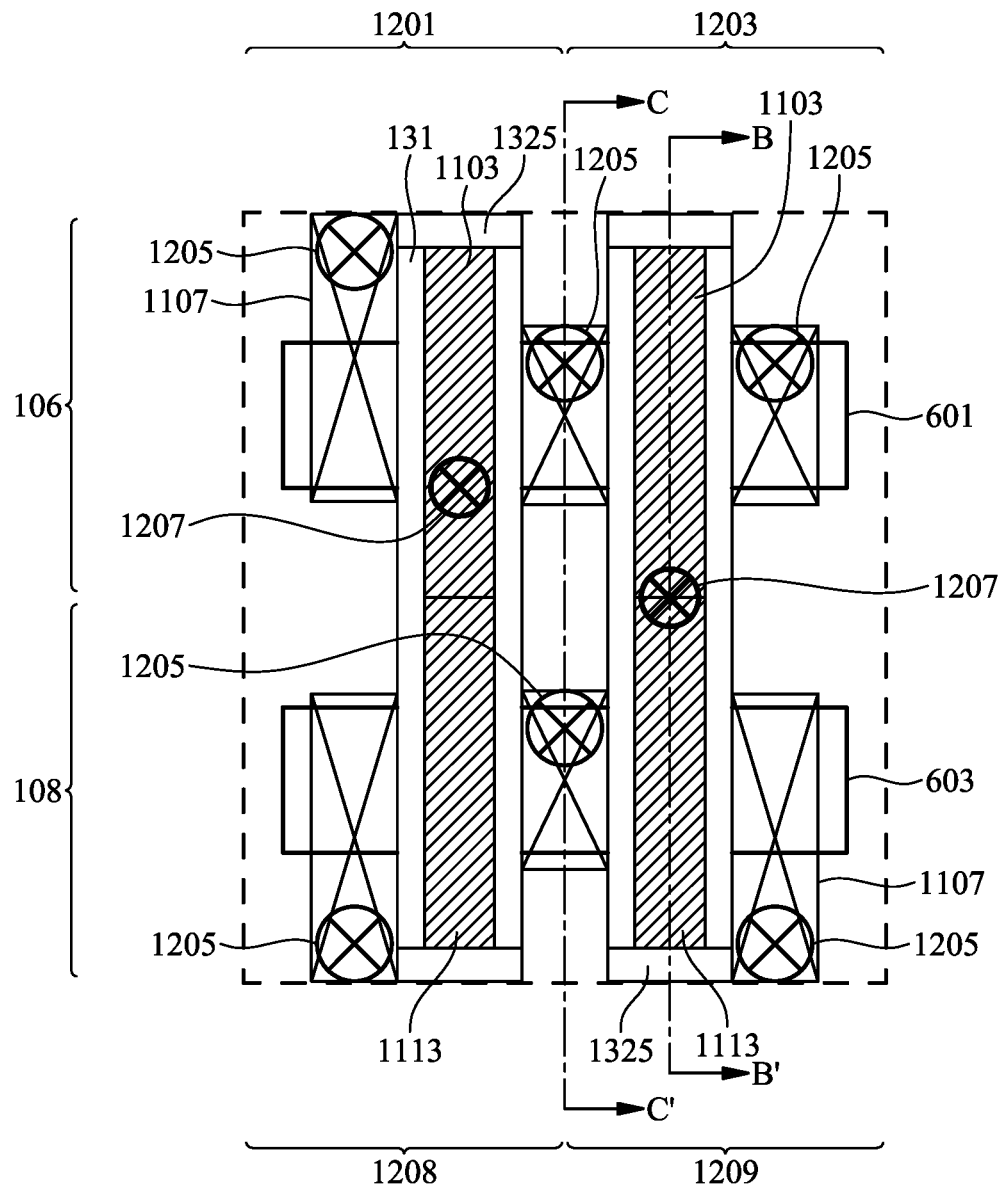
FIG. 12A illustrates a physical layout of the semiconductor device comprising a set of GAA transistors, in accordance with some embodiments.

FIG. 12A illustrates a top down view of one embodiment of NMOS gate all around transistors formed together with PMOS gate all around transistors the set of GAA transistors being arranged as a CMOS device, in accordance with some embodiments. In an embodiment the first device region 106 is utilized to form a first NMOS gate all around transistor 1201 and a second NMOS gate all around transistor 1203. Both the first NMOS gate all around transistor 1201 and the second NMOS gate all around transistor 1203 utilize the same combination of the first nanostructures 901 and first source/drain regions 601, with multiple ones of the first gate electrode 1103 formed over the same combination of the first nanostructures 901 and the first source/drain regions 601. In these views, however, the first nanostructures 901 are covered by the first gate electrode 1103, so the first nanostructures 901 are not visible. Gate end dielectrics 1325 are formed at the ends of the first gate electrodes 1103 and the first spacers 131. Additionally, the source/drain contacts 1107 are formed to make electrical connection with each of the first source/drain regions 601 within the first device region 106 and source/drain vias 1205 and gate vias 1207 are formed to provide electrical connectivity.

Within the second device region 108, a first PMOS gate all around transistor 1208 and a second PMOS gate all around transistor 1209 are formed. Both the first PMOS gate all around transistor 1208 and the second PMOS gate all around transistor 1209 utilize the same combination of the second nanostructures 1001 and second source/drain regions 603, with multiple ones of the second gate electrodes 1113 formed over the same combination of the second nanostructures 1001 and the second source/drain regions 603. In these views, however, the second nanostructures 1001 are covered by the second gate electrodes 1113, so the second nanostructures 1001 are not visible. Gate end dielectrics 1325 are formed at the ends of the second gate electrodes 1113 and the first spacers 131. Additionally, the source/drain contacts 1107 are formed to make electrical connection with each of the second source/drain regions 603 within the second device region 108 and the source/drain vias 1205 and the gate vias 1207 are formed to provide electrical connectivity.

Figure 12B:
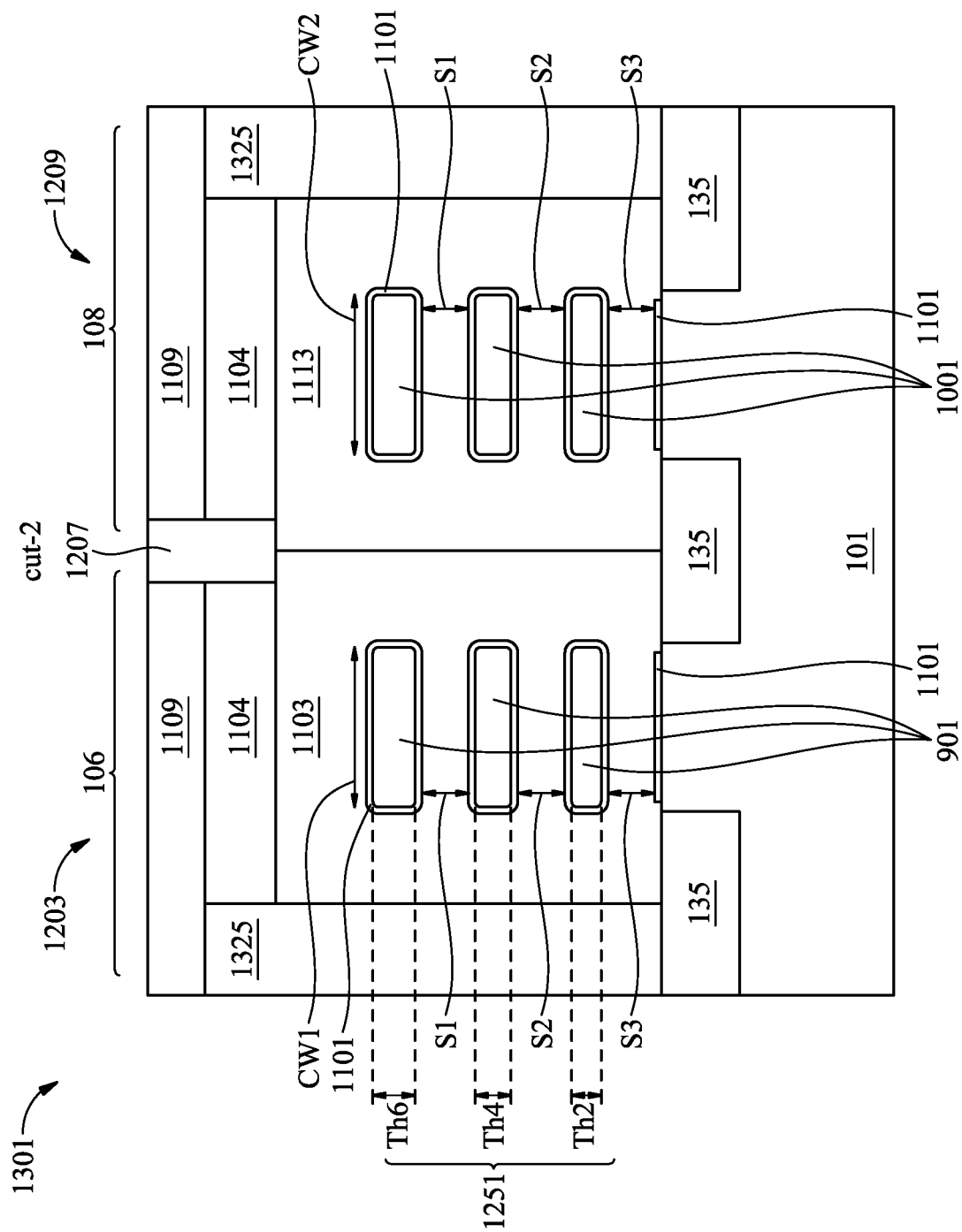
FIGS. 12B and 12C illustrate cross-sectional views through a set of the GAA transistors in the semiconductor device of FIG. 12A, the set of GAA transistors being arranged as a CMOS device, in accordance with some embodiments.

FIG. 12B illustrates the cross-sectional view taken through line B-B' of FIG. 12A, in accordance with some embodiments. As illustrated, the first gate electrode 1103 of the second NMOS gate all around transistor 1203 is formed adjacent to the second gate electrode 1113 of the second PMOS gate all around transistor 1209. Furthermore, the first nanostructures 901 provide a first vertical stack of channels 1251 of the second NMOS gate all around transistor 1203 and the second nanostructures 1001 provide a second vertical stack of channels 1253 of the second PMOS gate all around transistor 1209. As such, heights of the channels of the first vertical stack of channels 1251 and heights of the channels of the second vertical stack of channels 1253 are substantially equal to the thicknesses of the second layers 261 (Th6, Th4, and Th2), respectively. Furthermore, the sheet spacing (e.g., S1, S2, and S3) are substantially equal to the thicknesses of the first layers 251 (e.g., Th1, Th3, and Th5). Additionally, a single gate via of the gate vias 1207 is utilized to electrically connect both the first gate electrode 1103 and the second gate electrode 1113.

FIG. 12B further illustrates that the first nanostructures 901 may be formed to have a first channel width CW1 and the second nanostructures 1001 may be formed to have a second channel width CW2. The first channel width CW1 and the second channel width CW2 may be formed to a same width, or they may be formed to have different widths depending on the desired device characteristics of the second NMOS gate all around transistor 1203 and the second PMOS gate all around transistor 1209. According to some embodiments, the first channel width CW1 and the second channel width CW2 are formed to be approximately a same width of between about 3 nm and about 70 nm, such as about 30 nm. However, any suitable widths may be used.

Figure 12C:
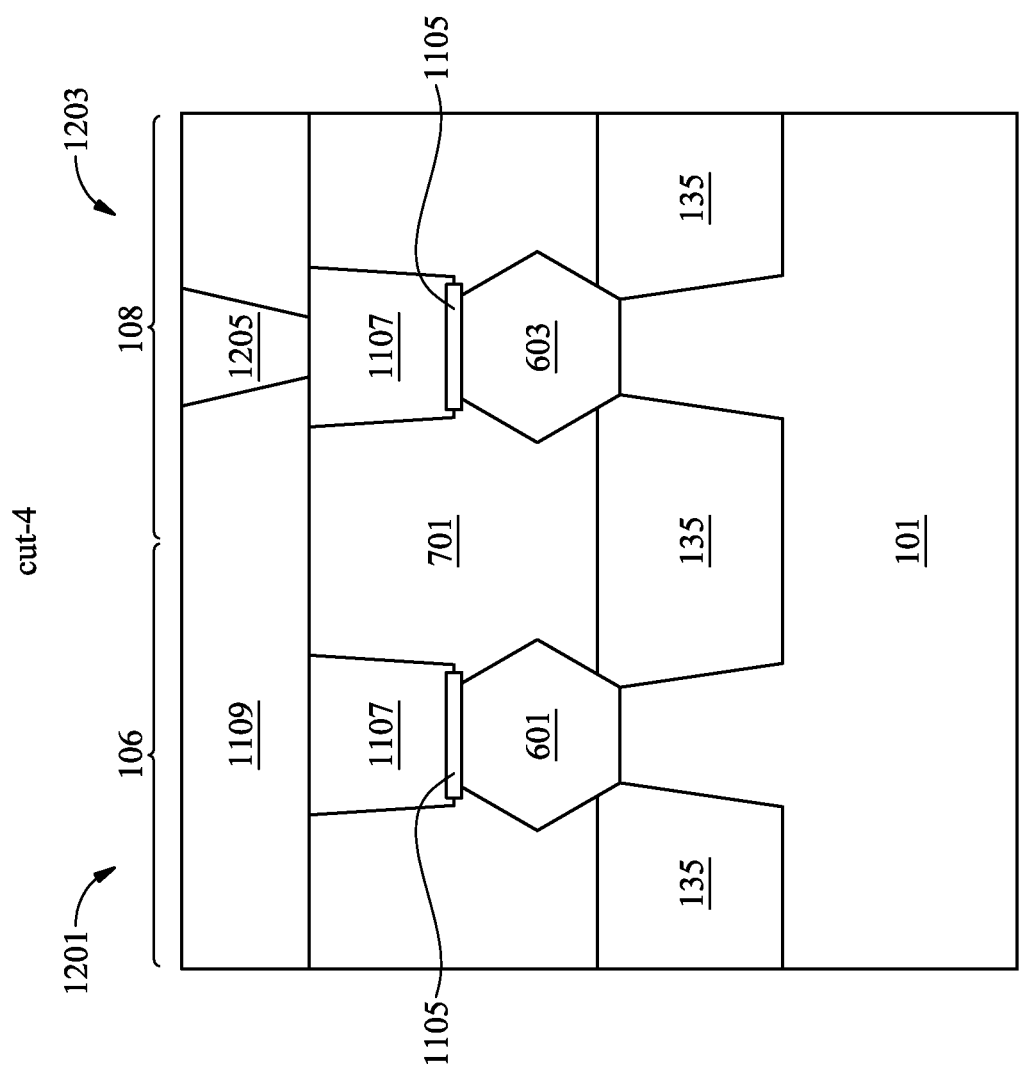

FIG. 12C illustrates the cross-sectional view taken through line C-C' of FIG. 12A, in accordance with some embodiments. As illustrated, the first source/drain region 601 of the second NMOS gate all around transistor 1203 is formed adjacent to the second source/drain region 603 of the second PMOS gate all around transistor 1209. Furthermore, the first source/drain regions 601 and the second source/drain region 603 are illustrated with facet limited surfaces of the epitaxially grown materials formed over the substrate 101 and between sidewalls of the first isolation regions 135. The first ILD layer 701 is then formed over the first source/drain region 601 of the second NMOS gate all around transistor 1203 and over the second source/drain region 603 of the second PMOS gate all around transistor 1209. Openings may be formed in the first ILD layer 701 to expose surfaces of the first source/drain region 601 and the second source/drain region 603. The silicide contacts 1105 may be formed through the openings in the first ILD layer 701 and over the exposed surfaces of the first source/drain regions 601 and the second source/drain region 603. The source/drain contacts 1107 may be deposited over the silicide contacts 1105 and fill a remainder of the openings in the first ILD layer 701 and then planarized with a surface of the first ILD layer 701. The second ILD layer 1109 is then deposited over the planar surfaces of the source/drain contacts 1107 and the first ILD layer 701. The source/drain vias 1205 are then formed through the second ILD layer 1109 to electrically connect to the source/drain contacts 1107.

The embodiments disclosed herein relate to semiconductor devices and their manufacturing methods, and more particularly to semiconductor devices comprising a transistor having gate all around (GAA) transistor structures and manufacturing methods thereof. According to some embodiments, a vertical stack of channels (e.g., nanostructures surrounded by a gate dielectric layer) are formed with a top channel having a greater vertical thickness than the vertical thicknesses of the other channels of the vertical stack. According to some embodiments, each transistor of a GAA device comprises three vertically stacked channels, wherein a top channel of the vertical stack has a vertical thickness that is greater than a vertical thickness of a center channel of the vertical stack and the vertical thickness of the center channel is greater than a vertical thicknesses of a bottom channel of the vertical stack. In some embodiments, the epi-growth scheme process for forming the vertically stacked nanosheet comprises forming a top layer to a greater thickness than the thicknesses of the other layers of the vertically stacked nanosheet.

Furthermore, the present embodiments provide one or more of the following advantages. The epi-growth scheme process for forming different sheet thicknesses of the SiGe/Si layers allows for top channel crowding issues to be mitigated for GAA devices and allow for low resistance paths of LDD portions in a vertical stack of channels to be formed between source/drain regions for GAA devices. In addition, tuning of the On-current ($I_{ON}$) and drain induced barrier loading (DIBL) can be controlled through the multiple sheet thicknesses of the device structure. Furthermore, enhanced S/D strain effects can be achieved due to an increased volume of deep S/D regions. As such, further ion gain performance as well as increased S/D to bottom sheet ends connection margin may also be achieved.

In accordance with embodiments, a method includes depositing a first sheet over a semiconductor substrate; depositing a first nanosheet over the first sheet, the first nanosheet including a first material and having a first thickness; depositing a second sheet over the first nanosheet; depositing a second nanosheet over the second sheet, the second nanosheet including the first material and having a second thickness greater than the first thickness; patterning the first sheet, the first nanosheet, the second sheet, and the second nanosheet into a fin; removing the first sheet and the second sheet to form a first nanostructure from the first nanosheet and a second nanostructure from the second nanosheet; depositing a gate dielectric layer around the first nanostructure and the second nanostructure; and depositing a gate electrode around the gate dielectric layer. In an embodiment of the method, a difference between the second thickness and the first thickness is within a range of at least 0.5 nm to at most 3 nm. In an embodiment of the method, a ratio of the first thickness and the second thickness is between about 1.05 and about 1.3. In an embodiment, the method further includes, after the patterning of the first sheet, etching the first sheet, the first nanosheet, the second sheet, and the second nanosheet to expose the semiconductor substrate; recessing the first sheet to form a first recess; and forming a first dielectric spacer in the first recess. In an embodiment, the method further includes wherein the first nanostructure has a third thickness and the second nanostructure has a fourth thickness greater than the third thickness. In an embodiment, the method further includes reducing a thickness of a central portion of the first nanostructure. In an embodiment of the method, a distal end portion of the first nanostructure retains the first thickness.

In accordance with an embodiment, a method includes etching an opening through a multilayer stack over a semiconductor substrate, the multilayer stack including first layers having a first material and second layers having a second material different from the first material; performing a wire release process to remove the first layers and form a stack of nanostructures, the stack of nanostructures including a first nanostructure having a first thickness at a first distance from the semiconductor substrate and an intermediate nanostructure having a second thickness at a second distance from the semiconductor substrate, the first thickness being greater than the second thickness and the first distance being greater than the second distance; depositing a gate dielectric layer around the stack of nanostructures; and depositing a gate electrode around the gate dielectric layer. In an embodiment of the method, thicknesses of the nanostructures progressively increase as a distance increases from the semiconductor substrate. In an embodiment of the method, a difference between the first thickness and the second thickness is within a range of about 0.5 nm to about 3 nm. In an embodiment, the method also includes recessing the first layers of the multilayer stack to form recesses; depositing a dielectric material in the recesses; and etching the dielectric material to form spacers. In an embodiment of the method, the performing the wire release process further reduces a thickness of a central portion of a topmost nanostructure without reducing a thickness of a distal end portion of the topmost nanostructure. In an embodiment, the method includes etching into the semiconductor substrate to a depth of at least 3 nm. In an embodiment of the method, the stack of nanostructures comprises the first nanostructure, the intermediate nanostructure, and a second nanostructure.

In accordance with another embodiment, a vertical stack of nano structures, the vertical stack of nanostructures extending between a first source/drain region and a second source/drain region, wherein thicknesses of the nanostructures progressively increase as a distance increases from the substrate and wherein an increase in thickness from one nanostructure to an adjacent nanostructure is between about 1.05 times to about 1.3 times; a gate electrode surrounding a portion of each one of the vertical stack of nanostructures and extending between individual nanostructures within the vertical stack of nanostructures; and a gate dielectric separating the gate electrode from the vertical stack of nanostructures. In an embodiment of the device, the vertical stack of nanostructures includes a topmost nanostructure having a first thickness and an intermediate nanostructure having a second thickness, the second thickness being within a range of between about 0.5 nm and about 3 nm of the first thickness. In an embodiment of the device, a thickness of a distal end portion of one of the nanostructures is greater than a thickness of a central portion of the one of the nanostructures. In an embodiment, the first source/drain region extends at least 3 nm into the substrate. In an embodiment of the device, a first distance between a first nanostructure within the vertical stack of nanostructures and a second nanostructure within the vertical stack of nanostructures is equal to a second thickness between the second nanostructure and a third nanostructure within the vertical stack of nanostructures. In an embodiment, the device further includes a gate end dielectric adjacent to the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a vertical stack of nanostructures over a substrate, the vertical stack of nanostructures extending between a first source/drain region and a second source/drain region, wherein the first source/drain region and the second source/drain region extend into the substrate, wherein the nanostructures comprise:
      a bottom nanostructure;
      a middle nanostructure, wherein the bottom nanostructure is disposed between the substrate and the middle nanostructure; and
      a top nanostructure, wherein the middle nanostructure is disposed between the bottom nanostructure and the top nanostructure, wherein thicknesses of the nanostructures progressively increase from a bottom to a top of the vertical stack of nanostructures, wherein the bottom of the vertical stack of nanostructures is closer to the substrate than the top of the vertical stack of nanostructures, and wherein a thickness of one nanostructure is 1.05 times to 1.3 times a thickness of an adjacent nanostructure;
   a gate electrode surrounding each of the vertical stack of nanostructures, wherein a first portion of the gate electrode and a second portion of the gate electrode is separated by the top nanostructure, wherein a first spacer extends along a first sidewall of the first portion of the gate electrode, wherein a second spacer extends along a first sidewall of the second portion of the gate electrode, and wherein the first spacer and the second spacer comprise different materials; and
   a gate dielectric separating the gate electrode from the vertical stack of nanostructures.

2. The device of claim 1, wherein the top nanostructure has a first thickness and the middle nanostructure has a second thickness, a difference between the first thickness and the second thickness being between 0.5 nm and 3 nm.

3. The device of claim 1, wherein a thickness of a distal end portion of one of the nanostructures is greater than a thickness of a central portion of the one of the nanostructures.

4. The device of claim 1, further comprising a gate via disposed over the vertical stack of nanostructures.

5. The device of claim 1, wherein a first distance is between the substrate and the bottom nanostructure, a second distance is between the bottom nanostructure and the middle nanostructure, and a third distance is between the middle nanostructure and the top nanostructure, and wherein the first distance, the second distance, and the third distance are equal.

6. The device of claim 1, further comprising a gate end dielectric in contact with a second sidewall of the first portion of the gate electrode.

7. A device comprising:
   a stack of nanostructures over a substrate, wherein the stack of nanostructures comprise:
      a first nanosheet of a first thickness, wherein the first nanosheet is spaced apart from the substrate by a first distance;
      a second nanosheet of a second thickness, wherein the second thickness is greater than the first thickness, wherein the second nanosheet is spaced apart from the first nanosheet by a second distance, and wherein the second distance is equal to the first distance; and
      a third nanosheet of a third thickness, wherein the third thickness is greater than the second thickness, wherein the third nanosheet is spaced apart from the second nanosheet by a third distance, and wherein the third distance is equal to the second distance, wherein the first nanosheet is disposed between the substrate and the second nanosheet, wherein the second nanosheet is disposed between the first nanosheet and the third nanosheet, and wherein the first nanosheet, the second nanosheet, and the third nanosheet comprise a same first material;

an electrode wrapping around the first nanosheet, the second nanosheet, and the third nanosheet, wherein a first portion of the electrode and a second portion of the electrode is separated by the third nanostructure, wherein a first spacer extends along a sidewall of the first portion of the electrode, wherein the first spacer comprises a second material, wherein a second spacer extends along a sidewall of the second portion of the electrode, wherein the second spacer comprises a third material, and wherein the second material is different from the third material; and a first insulating layer disposed between the electrode and the first nanosheet, a second insulating layer disposed between the electrode and the second nanosheet, and a third insulating layer disposed between the electrode and the third nanosheet, wherein the third insulating layer is disposed between the second portion of the electrode and the second spacer, wherein the first insulating layer, the second insulating layer, and the third insulating layer comprise a same fourth material different from the first material.

8. The device of claim 7, wherein a difference between the first thickness and the second thickness is in a range from 0.5 nm to 3 nm.

9. The device of claim 7, wherein a difference between the second thickness and the third thickness is in a range from 0.5 nm to 3 nm.

10. The device of claim 7, wherein a ratio of the second thickness to the first thickness is in a range from 1.05 to 1.3.

11. The device of claim 7, wherein a ratio of the third thickness to the second thickness is in a range from 1.05 to 1.3.

12. The device of claim 7, wherein a difference between the first thickness and the third thickness is in a range from 1 nm to 6 nm.

13. The device of claim 7, wherein a ratio of the third thickness to the first thickness is in a range from 1.1 to 1.69.

14. A semiconductor device comprising:

semiconductor nanostructures over a substrate, the semiconductor nanostructures extending between a first source/drain region and a second source/drain region, wherein the first source/drain region and the second source/drain region extend into the substrate, the semiconductor nanostructures comprising:

a first semiconductor nanostructure at a first distance from the substrate;

a second semiconductor nanostructure at a second distance from the substrate, wherein the second distance is greater than the first distance; and a third semiconductor nanostructure at a third distance from the substrate, wherein the third distance is greater than the second distance, wherein thicknesses of the semiconductor nanostructures progressively increase as separation distances between the substrate and the semiconductor nanostructures increase, and a difference in thickness between one nanostructure and an adjacent nanostructure is in a range from 0.5 nm to 3 nm;

gate dielectric layers encircling the semiconductor nanostructures along longitudinal axes of the semiconductor nanostructures, wherein a bottom surface of the first source/drain region is below an interface between the gate dielectric layers and the substrate; and a gate electrode encircling the semiconductor nanostructures along the longitudinal axes of the semiconductor nanostructures, wherein the gate dielectric layers separate the gate electrode from the semiconductor nanostructures, wherein a first portion of the gate electrode and a second portion of the gate electrode is separated by the third nanostructure, wherein a first spacer extends along a first sidewall of the first portion of the gate electrode, wherein a first gate dielectric layer of the gate dielectric layers extends between the first spacer and the first portion of the gate electrode, wherein a second spacer extends along a first sidewall of the second portion of the gate electrode, wherein a second gate dielectric layer of the gate dielectric layers extends between the second spacer and the second portion of the gate electrode, and wherein the first spacer and the second spacer comprise different materials.

15. The semiconductor device of claim 14, wherein distal end portions of each of the semiconductor nanostructures are thicker than a corresponding central portion of each of the semiconductor nanostructures.

16. The semiconductor device of claim 15, wherein a distal end portion of the first semiconductor nanostructure has a first thickness and a distal end portion of the second semiconductor nanostructure has a second thickness, and wherein a ratio of the second thickness to the first thickness is in a range from 1.05 to 1.3.

17. The semiconductor device of claim 15, wherein a distal end portion of the first semiconductor nanostructure has a first thickness and a distal end portion of the third semiconductor nanostructure has a second thickness, and wherein a ratio of the second thickness to the first thickness is in a range from 1.1 to 1.69.

18. The semiconductor device of claim 14, wherein first semiconductor nanostructure is spaced apart from the substrate by a fourth distance, wherein first semiconductor nanostructure is spaced apart from the second semiconductor nanostructure by a fifth distance, wherein second semiconductor nanostructure is spaced apart from the third semiconductor nanostructure by a sixth distance, and wherein the fourth distance equals to the fifth distance and the fifth distance equals to the sixth distance.

19. The semiconductor device of claim 14, further comprising a gate end dielectric on a second sidewall of the first portion of the gate electrode.

20. The semiconductor device of claim 14, further comprising a gate via disposed over the semiconductor nanostructures, wherein the third semiconductor nanostructure is a semiconductor nanostructure closet to the gate via.

\* \* \* \* \*